US012787562B2

(12) United States Patent
Park et al.

(10) Patent No.: US 12,787,562 B2
(45) Date of Patent: Nov. 3, 2026

(54) DISPLAY DEVICE AND METHOD OF MANUFACTURING DISPLAY DEVICE

(71) Applicant: Samsung Display Co., LTD., Yongin-si (KR)

(72) Inventors: Hee Min Park, Yongin-si (KR); A Rong Kim, Yongin-si (KR); Young Min Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 210 days.

(21) Appl. No.: 18/745,021

(22) Filed: Jun. 17, 2024

(65) Prior Publication Data

US 2025/0204158 A1 Jun. 19, 2025

(30) Foreign Application Priority Data

Dec. 19, 2023 (KR) ........................ 10-2023-0185804

(51) Int. Cl.
*H10K 59/122* (2023.01)
*H10K 59/12* (2023.01)

(52) U.S. Cl.
CPC ....... *H10K 59/122* (2023.02); *H10K 59/1201* (2023.02)

(58) Field of Classification Search
CPC ......................... H10K 59/122; H10K 59/1201
USPC .................................................. 313/498–512
See application file for complete search history.

(56) References Cited

U.S. PATENT DOCUMENTS

| | | | | |
|---|---|---|---|---|
| 9,088,005 | B2 * | 7/2015 | Hong | H10K 59/8722 |
| 9,349,784 | B2 | 5/2016 | Lee et al. | |
| 11,348,983 | B1 | 5/2022 | Choung et al. | |
| 2021/0134902 | A1 | 5/2021 | Lee et al. | |
| 2022/0208883 | A1 | 6/2022 | Kim et al. | |
| 2022/0208887 | A1 | 6/2022 | Yoon et al. | |
| 2023/0209976 | A1 | 6/2023 | Kim et al. | |
| 2024/0292707 | A1 * | 8/2024 | Park | G06F 3/0443 |
| 2025/0176367 | A1 * | 5/2025 | Park | H10K 59/8052 |

FOREIGN PATENT DOCUMENTS

| | | |
|---|---|---|
| KR | 10-2246294 | 4/2021 |
| KR | 10-2022-0096188 | 7/2022 |

* cited by examiner

*Primary Examiner* — Christopher M Raabe
(74) *Attorney, Agent, or Firm* — Womble Bond Dickinson (US) LLP

(57) ABSTRACT

A display device and a method of manufacturing the display device. The display device may include a sub-pixel area, a pixel circuit layer may include a line electrically connected to the pixel circuit. At least a portion of a capping layer is in contact with the pixel defining layer. The line is disposed on a pixel defining layer and includes a first line and a second line spaced apart from each other, each forming a closed loop. The first line surrounds the sub-pixel area in a plan view, the second line surrounds the first line in a plan view. A light emitting part is disposed in an area surrounded by the first line.

11 Claims, 24 Drawing Sheets

S220

S240, S260, S280

S290

DISPLAY DEVICE AND METHOD OF MANUFACTURING DISPLAY DEVICE

CROSS-REFERENCE TO RELATED APPLICATIONS

This application claims priority under 35 U.S.C. § 119 from Korean Patent Application No. 10-2023-0185804 filed on Dec. 19, 2023 in the Korean Intellectual Property Office, the entire contents of which are incorporated herein by reference.

BACKGROUND

1. Technical Field

The disclosure relates to a display device and a method of manufacturing the display device.

2. Description of the Related Art

As information technology develops, importance of a display device as a connection medium between a user and information is increased. The display device may include a light emitting element, and sub-pixels adjacent to each other may be formed using the light emitting element.

As demand for high-quality display devices increases, a structure of the sub-pixels is becoming more refined, and a structure in which a leakage current between the sub-pixels does not occur is required.

In order to reconsider reliability of an electrical signal supplied to the sub-pixel, a voltage drop risk due to a resistance increase of a conductive structure to which the electrical signal is supplied is required to be reduced.

SUMMARY

An aspect of the disclosure is to provide a display device and a method of manufacturing the display device in which a voltage drop risk to a cathode electrode is reduced.

An aspect of the disclosure is to provide a display device and a method of manufacturing the display device in which a risk of a leakage current is reduced.

An aspect of the disclosure is to provide a display device and a method of manufacturing the display device having excellent display quality capable of providing high-resolution of image.

An aspect of the disclosure is to provide a display device and a method of manufacturing the display device of which convenience of a manufacturing process is improved.

According to an embodiment, a display device may include a sub-pixel area. The display device may include a pixel circuit layer including a base layer and a pixel circuit disposed on the base layer, and a light emitting element layer disposed on the pixel circuit layer and including a light emitting element, a pixel defining layer, a capping layer, and a line electrically connected to the pixel circuit. The light emitting element may include an anode electrode, a cathode electrode, and a light emitting part of which at least a portion is disposed between the anode electrode and the cathode electrode. The pixel defining layer may cover at least a portion of the anode electrode. At least a portion of the capping layer may be in contact with the pixel defining layer. The line may be disposed on the pixel defining layer and may include a first line and a second line spaced apart from each other, each of the first line and the second line may be disposed in a closed loop. The first line may surround the sub-pixel area in a plan view, the second line may surround the first line in a plan view. The light emitting part may be disposed in an area surrounded by the first line.

According to an embodiment, the line may include a conductive material having an electrical conductivity less than about $4.0\times10^{7}$ (S/m) at about 20° C.

According to an embodiment, the line may include aluminum (Al) or molybdenum (Mo).

According to an embodiment, the first line and the second line may include a same material, and each of the first line and the second line may be disposed on a surface of the pixel defining layer.

According to an embodiment, the first line may be disposed around the sub-pixel area. The second line may be disposed around the first line. The sub-pixel area may include a first sub-pixel area, a second sub-pixel area, and a third sub-pixel area. The first line may include a first line portion surrounding the first sub-pixel area, a second line portion surrounding the second sub-pixel area, and a third line portion surrounding the third sub-pixel area.

According to an embodiment, the cathode electrode may include a first cathode electrode overlapping the first sub-pixel area, a second cathode electrode overlapping the second sub-pixel area, and a third cathode electrode overlapping the third sub-pixel area. The first cathode electrode, the second cathode electrode, and the third cathode electrode may be physically separated from each other.

According to an embodiment, the pixel circuit layer may include a first power line and a second power line having different potentials. The first power line may be electrically connected to the pixel circuit. The second power line may be electrically connected to the cathode electrode through the first line.

According to an embodiment, the display device may further include a display area and a non-display area surrounding at least a portion of the display area. The first line may be electrically connected to the second power line through a contact portion at least partially passing through the pixel defining layer. The second power line may have a thickness greater than that of the cathode electrode. The contact portion may be disposed in the display area.

According to an embodiment, the capping layer may include a first capping layer and a second capping layer disposed on the first capping layer. The first capping layer may cover the first line and may not cover the second line. The second capping layer may cover the second line.

According to an embodiment, each of the second capping layer and the pixel defining layer may include an inorganic material and the second capping layer and the pixel defining layer may contact each other in an area adjacent to the second line.

According to an embodiment of the disclosure, a display device may include a display area and a non-display area surrounding at least a portion of the display area, a pixel circuit layer including a base layer, a pixel circuit and a power line disposed on the base layer, and a via layer covering the power line, and a light emitting element layer disposed on the pixel circuit layer and including a light emitting element, a pixel defining layer, and a line electrically connected to the pixel circuit. The light emitting element may include an anode electrode, a cathode electrode, and a light emitting part, at least a portion of the light emitting part may be disposed between the anode electrode and the cathode electrode. The pixel defining layer may overlap the anode electrode in a plan view. The line may be directly disposed on the pixel defining layer and may include a first line and a second line spaced apart from each other.

The power line may be disposed across the display area and the non-display area. The cathode electrode and the power line may be electrically connected in the display area through a contact member passing through the via layer. The power line may have a thickness greater than that of the cathode electrode.

According to an embodiment of the disclosure, a method of manufacturing a display device may include manufacturing a pixel circuit layer, and manufacturing a light emitting element layer disposed on the pixel circuit layer, the light emitting element layer may include a light emitting element. Manufacturing the light emitting element layer may include forming an anode electrode, a pixel defining layer, and lines on the pixel circuit layer, and forming a sub-pixel by patterning a plurality of layers near the lines. The lines may be disposed on the pixel defining layer and may include a first line and a second line spaced apart from each other, and the first line may be disposed closer to the anode electrode than the second line. The patterning of the plurality of layers near the lines may include forming a base light emitting part, removing at least a portion of the base light emitting part adjacent to the first line by supplying a first voltage to the first line, forming a base cathode electrode and a first base capping layer, and removing at least a portion of the base cathode electrode, at least a portion of the first base capping layer, and at least a portion of the base light emitting part adjacent to the second line by supplying a second voltage to the second line.

According to an embodiment, the pixel circuit layer may include a pixel circuit, a first power line electrically connected to the pixel circuit, and a second power line having a potential different from that of the first power line. The forming of the lines may include electrically connecting the first line to the second power line.

According to an embodiment, the forming of the base light emitting part may include entirely depositing the base light emitting part on the pixel circuit layer.

According to an embodiment, the removing of the at least a portion of the base light emitting part adjacent to the first line may include providing a first light emitting part disposed in an area surrounded by the first line.

According to an embodiment, the forming of the base cathode electrode may include electrically connecting the base cathode electrode to the first line, and causing the base cathode electrode to contact the pixel defining layer in an area adjacent to the first line.

According to an embodiment, the removing of the at least a portion of the base light emitting part adjacent to the first line may include forming a first opening exposing at least a portion of the pixel defining layer. The removing of the at least a portion of the base cathode electrode, the at least a portion of the first base capping layer, and the at least a portion of the base light emitting part adjacent to the second line may include forming a second opening exposing at least a portion of the pixel defining layer.

According to an embodiment, the method may further include forming second base capping layer, and removing at least a portion of the first base capping layer, at least a portion of the base cathode electrode, and at least a portion of the base light emitting part disposed outside the second line.

According to an embodiment, the second base capping layer may contact the pixel defining layer in an area adjacent to the second line. Each of the second base capping layer and the pixel defining layer may include an inorganic material.

According to an embodiment, the method may further include entirely depositing an encapsulation layer on the pixel circuit layer.

According to an embodiment of the disclosure, a display device and a method of manufacturing the display device in which a voltage drop risk to a cathode electrode is reduced may be provided.

According to an embodiment of the disclosure, a display device and a method of manufacturing the display device in which a risk of a leakage current is reduced may be provided.

According to an embodiment of the disclosure, a display device and a method of manufacturing the display device having excellent display quality capable of providing high-resolution of image may be provided.

According to an embodiment of the disclosure, a display device and a method of manufacturing the display device of which convenience of a manufacturing process is improved may be provided.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
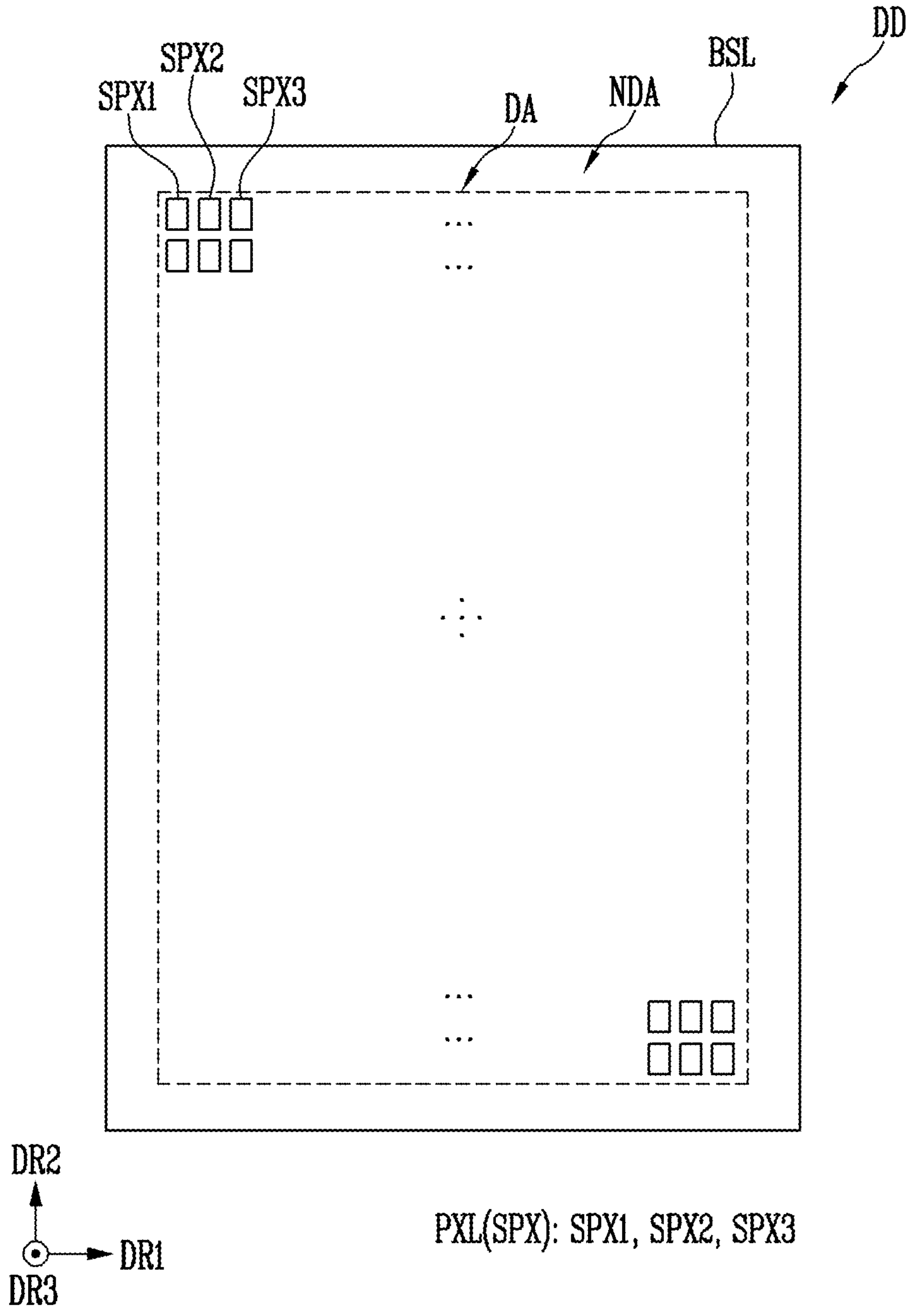
FIG. 1 is a schematic plan view illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

The disclosure relates to a display device and a method of manufacturing the display device. Hereinafter, a display device and a method of manufacturing the display device according to an embodiment is described with reference to the accompanying drawings.

FIG. 1 is a schematic plan view illustrating a display device according to an embodiment.

Referring to FIG. 1, the display device DD may include a base layer BSL and a pixel PXL disposed on the base layer BSL. Although not shown in the drawing, the display device DD may further include a driving circuit portion (for example, a scan driver and a data driver), lines (or heating lines of heating wires or resistive Joule heating lines), and pads for driving the pixel PXL.

The display device DD (or the base layer BSL) may include a display area DA and a non-display area NDA. The non-display area NDA may mean an area other than the display area DA. The non-display area NDA may surround at least a portion of the display area DA.

The base layer BSL may form a base surface of the display device DD. The base layer BSL may be a rigid or flexible substrate or film. For example, the base layer BSL may include a glass material. The base layer BSL may include a silicon material. The base layer BSL may include polyimide. However, the disclosure is not limited thereto The display area DA may mean an area where the pixel PXL is disposed. The non-display area NDA may mean an area where the pixel PXL may not be disposed. The driving circuit portion, the line, and the pads electrically connected to the pixel PXL of the display area DA may be disposed in the non-display area NDA.

According to an embodiment, the pixel PXL (or sub-pixels SPX) may be arranged according to a stripe or PENTILE™ arrangement structure, but are not limited thereto, and various embodiments may be applied to the disclosure.

According to an embodiment, the pixel PXL (or the sub-pixels SPX) may include a first sub-pixel SPX1, a second sub-pixel SPX2, and a third sub-pixel SPX3. Each of the first sub-pixel SPX1, the second sub-pixel SPX2, and the third sub-pixel SPX3 may be a sub-pixel. At least one of the first sub-pixel SPX1, the second sub-pixel SPX2, and the third sub-pixel SPX3 may form a pixel portion capable of emitting light of various colors.

Each of the first sub-pixel SPX1, the second sub-pixel SPX2, and the third sub-pixel SPX3 may emit light of a color.

For example, the first sub-pixel SPX1 may be a red pixel emitting light of red (for example, first color), the second sub-pixel SPX2 may be a green pixel emitting light of green (for example, second color), and the third sub-pixel SPX3 may be a blue pixel emitting light of blue (for example, third color). The red pixel may provide light of a wavelength range of 600 nm to 750 nm. The green pixel may provide light of a wavelength band of 480 nm to 560 nm. The blue pixel may provide light of a wavelength range of 370 nm to 460 nm.

According to an embodiment, the number of second sub-pixels SPX2 may be greater than the number of first sub-pixels SPX1 and the number of third sub-pixels SPX3. However, the color, type, number, and/or the like of the first sub-pixel SPX1, the second sub-pixel SPX2, and the third sub-pixel SPX3 forming each pixel portion are/is not limited to a specific example.

Figure 2:
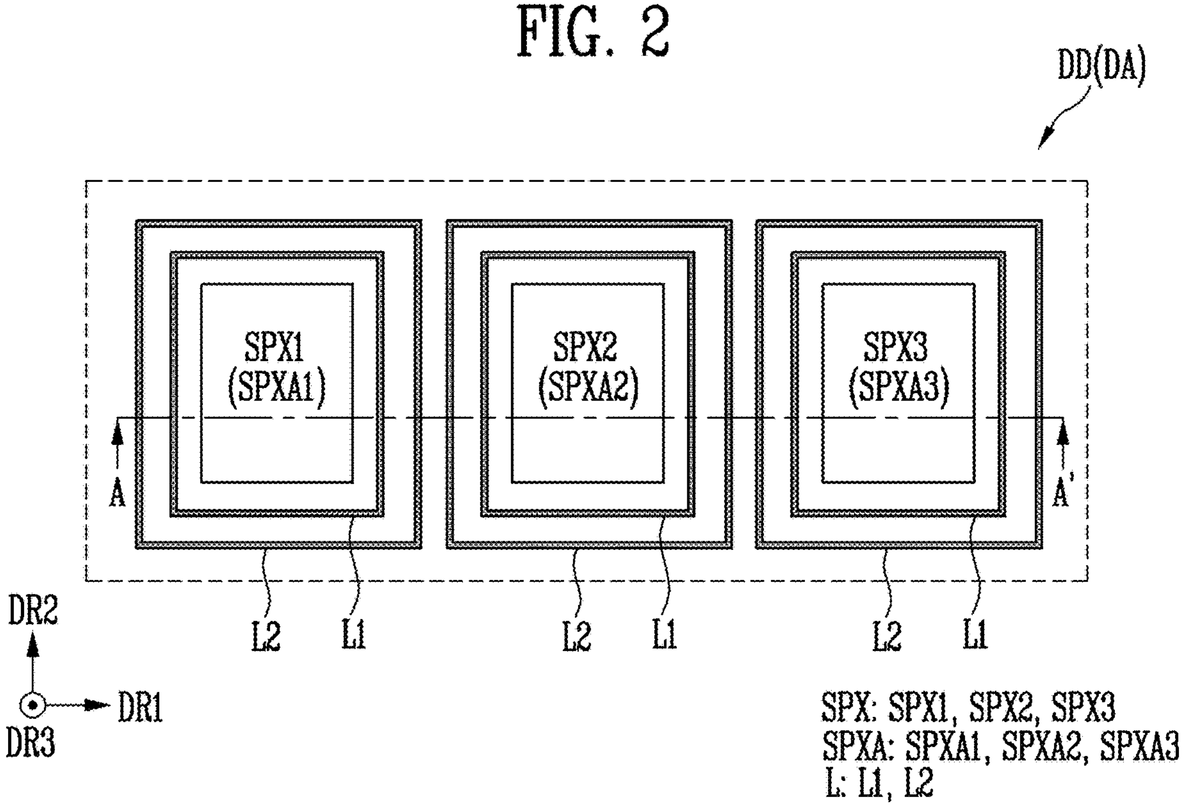
FIG. 2 is a schematic plan view illustrating a display area according to an embodiment.

FIG. 2 is a schematic plan view illustrating a display area according to an embodiment. For convenience of description, FIG. 2 shows a structure in which the first to third sub-pixels SPX1 to SPX3 may be sequentially disposed in a first direction DR1. However, the disclosure is not limited thereto.

Referring to FIG. 2, the display device DD may further include a line L disposed adjacent to the sub-pixels SPX.

According to an embodiment, the sub-pixels SPX may form a sub-pixel area SPXA. The sub-pixel area SPXA may be an area where light of a color may be visible. For example, the sub-pixel area SPXA may include a first sub-pixel area SPXA1 where the first sub-pixel SPX1 may be formed and light of a first color may be provided, a second sub-pixel area SPXA2 where the second sub-pixel SPX2 may be formed and light of a second color may be provided, and a third sub-pixel area SPXA3 where the third sub-pixel SPX3 may be formed and light of a third color may be provided.

The line L may include lines L corresponding to each of the sub-pixels SPX. For example, the line L may include a first line portion surrounding the first sub-pixel area SPXA1, a second line portion surrounding the second sub-pixel area SPXA2, and a third line portion surrounding the third sub-pixel area SPXA3. A shape of the lines L may be determined by a shape of each of the sub-pixels SPX. For example, the shape of the lines L may correspond to an edge shape of the sub-pixel areas SPXA.

The line L may include a first line L1 and a second line L2. The first line L1 and the second line L2 may be spaced apart from each other and may not overlap each other in a plan view. The first line L1 and the second line L2 may be physically spaced apart from each other. The first line L1 and the second line L2 may be electrically separated from each other.

The first line L1 may be disposed around the sub-pixel area SPXA. The first line L1 may be disposed between the sub-pixel area SPXA and the second line L2. The first line L1 may form a closed loop and may surround the sub-pixel area SPXA1 in a plan view.

The second line L2 may be disposed around the first line L1. The second line L2 may be disposed outside the closed loop formed by the first line L1. The second line L2 may form a closed loop and may surround the first line L1 in a plan view.

According to an embodiment, the first line L1 and the second line L2 may be formed in a same process. Accordingly, the first line L1 and the second line L2 may include a same material and may be disposed on a same layer. The first line L1 and the second line L2 may be disposed on a same layer (for example, a pixel defining layer PDL (refer to FIG. 3)). Each of the first line L1 and the second line L2 may be disposed on a surface of the pixel defining layer PDL.

Hereinafter, a display device DD including the line L is described with reference to FIGS. 3 to 8.

Figure 3:
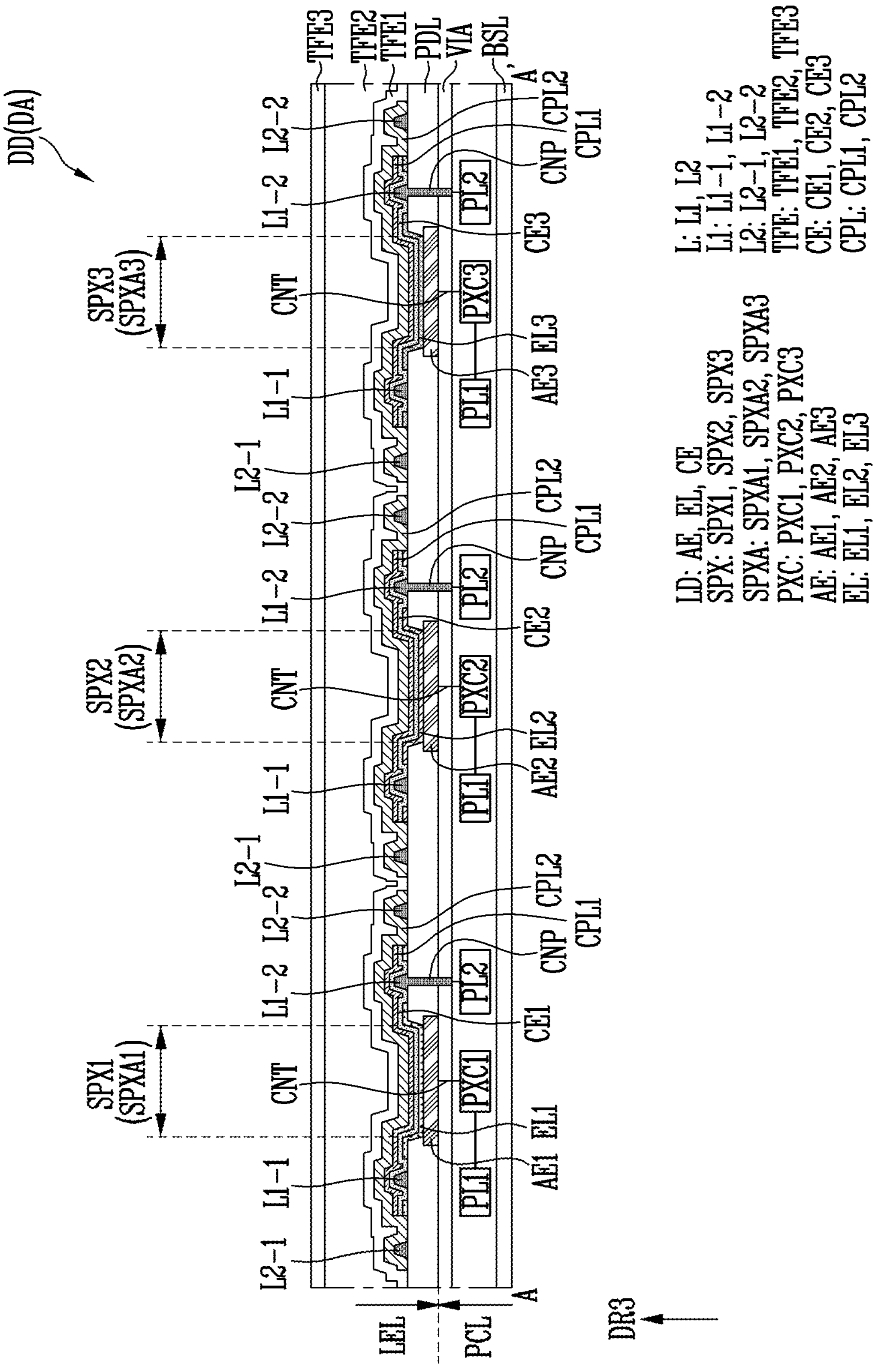
FIGS. 3 and 4 are schematic cross-sectional views illustrating a display device according to an embodiment.
Figure 4:
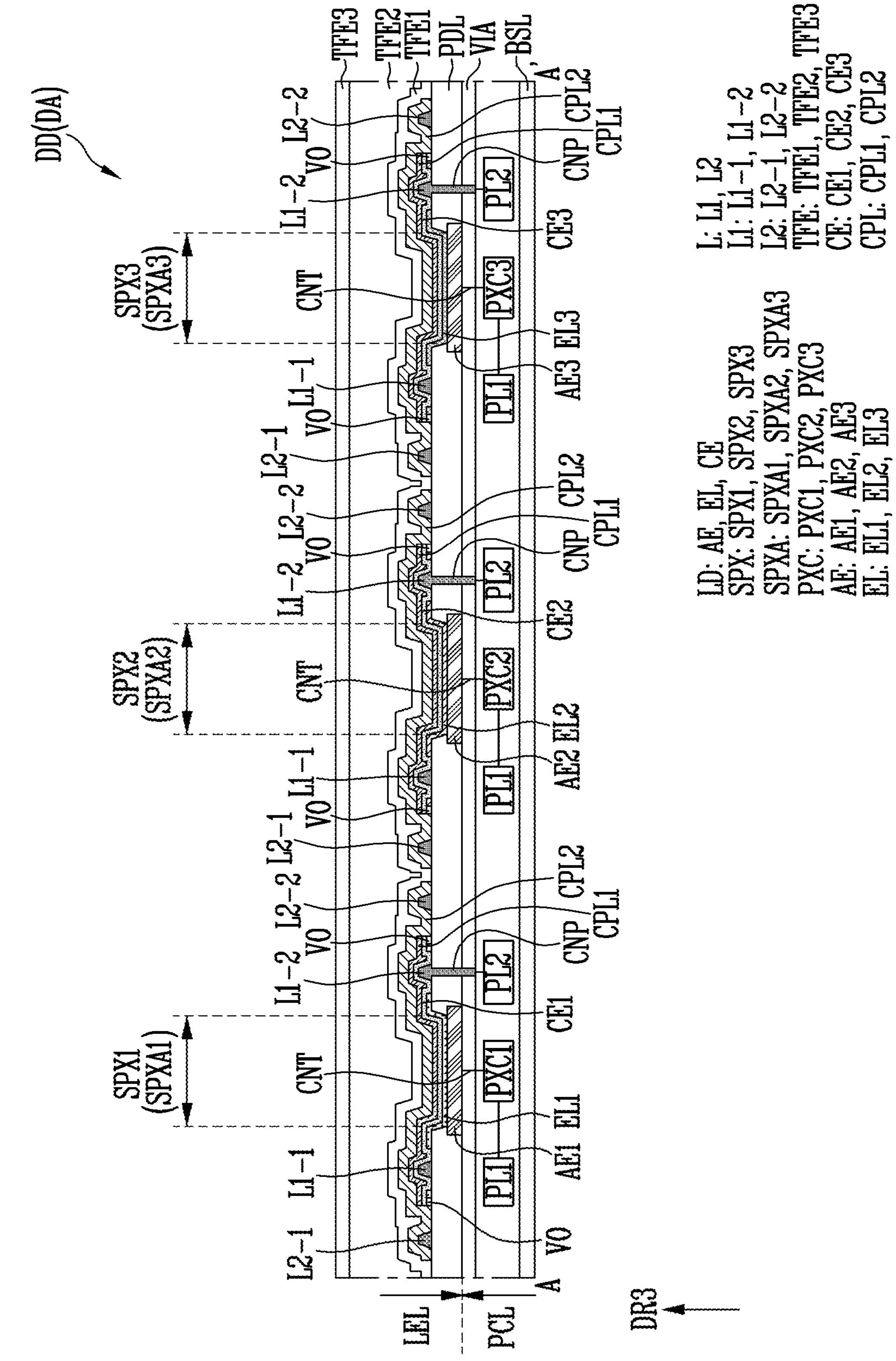
Figure 5:
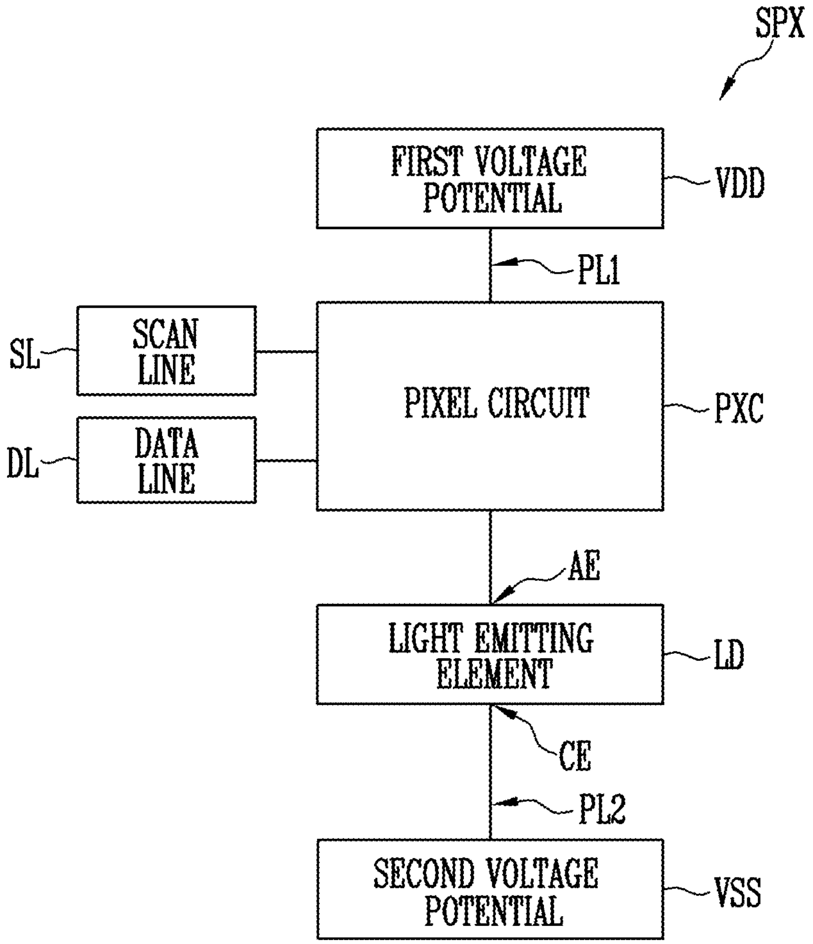
FIG. 5 is a schematic block diagram illustrating a connection structure for a sub-pixel including a light emitting element according to an embodiment.
Figure 6:
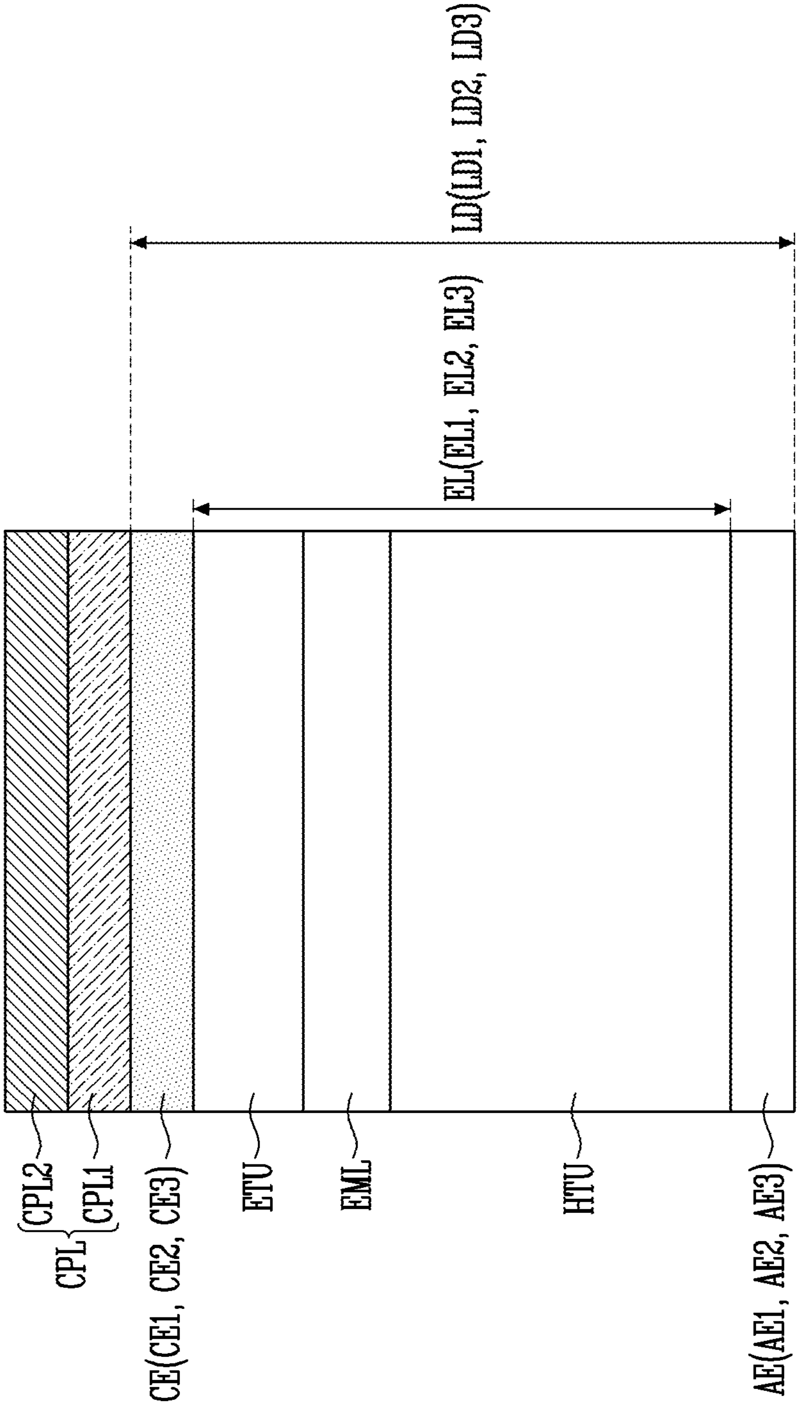
FIG. 6 is a schematic cross-sectional view illustrating a light emitting element and a capping layer according to an embodiment.
Figure 7:
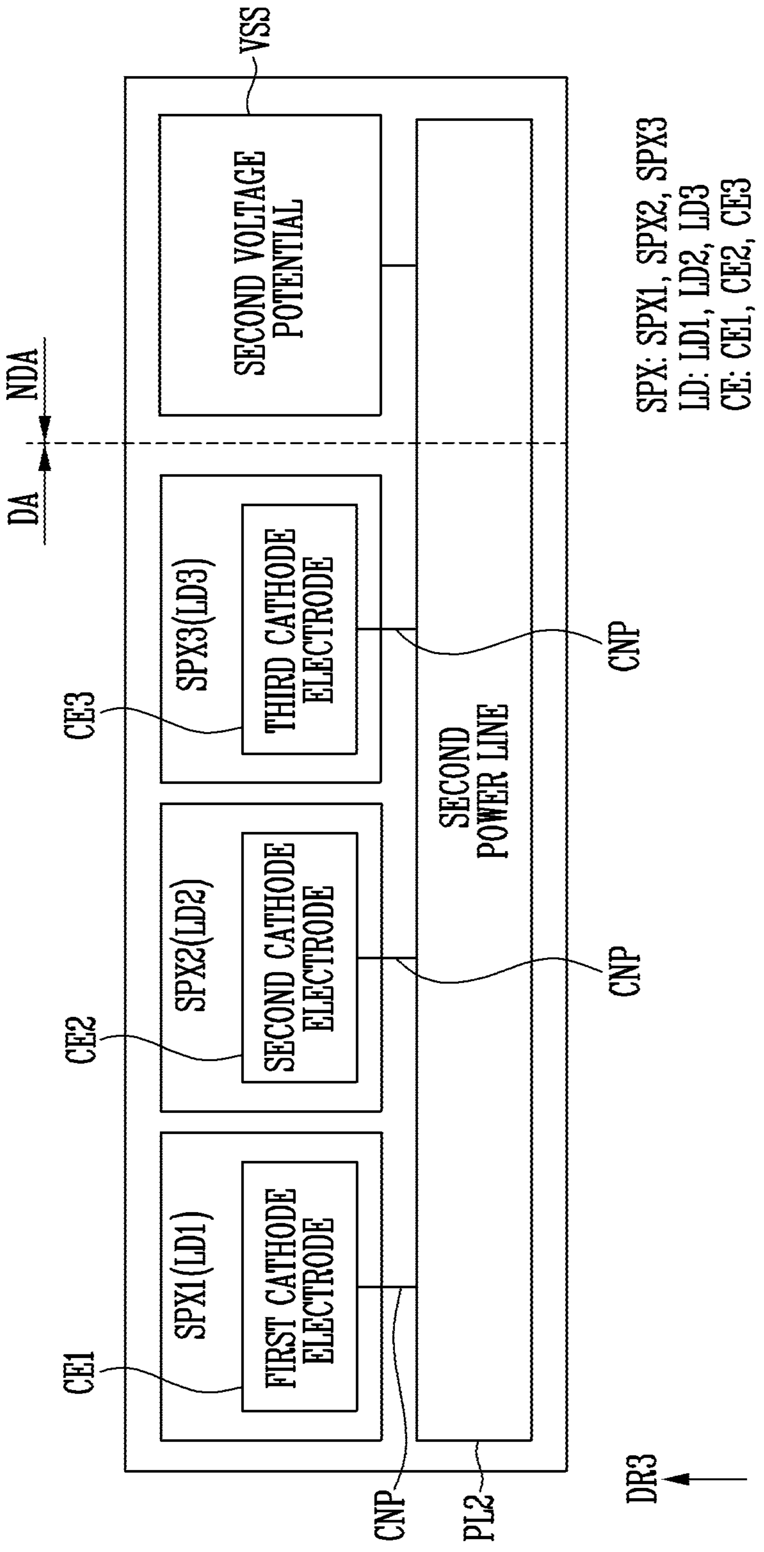
FIG. 7 is a schematic block diagram illustrating an electrical path through which a cathode signal is supplied according to an embodiment.
Figure 8:
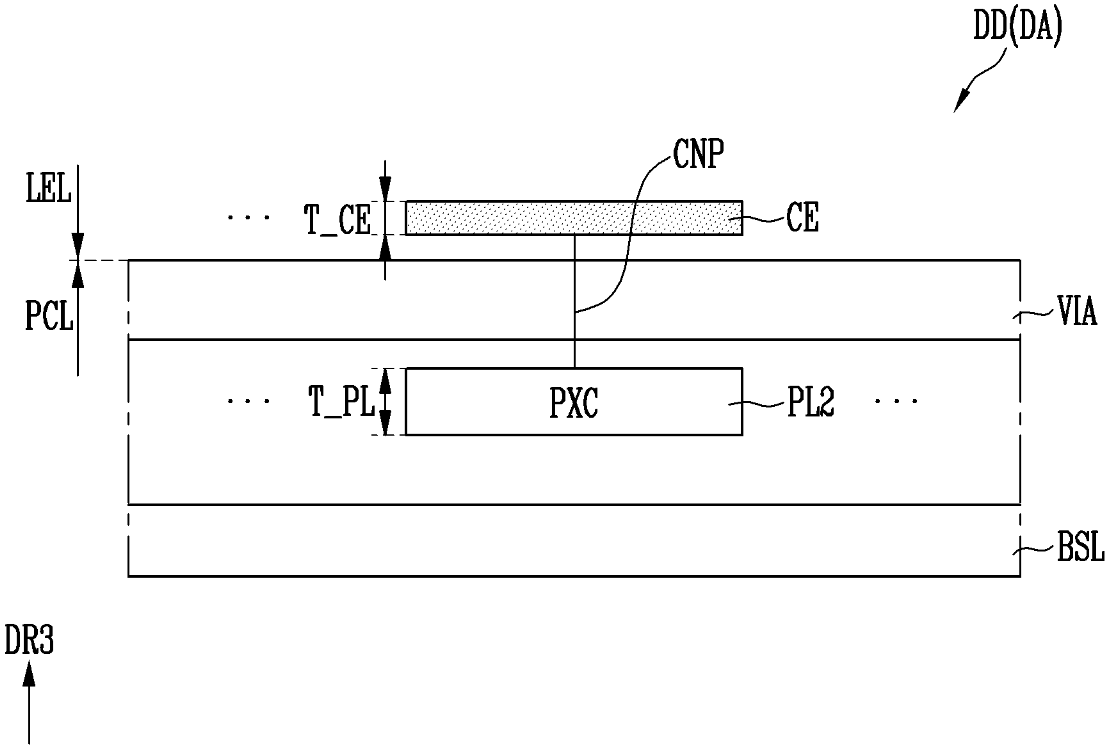
FIG. 8 is a schematic cross-sectional view illustrating a thickness relationship between a second power line and a cathode electrode according to the embodiment.

FIGS. 3 and 4 are schematic cross-sectional views illustrating a display device according to an embodiment. FIGS. 3 and 4 schematically show the display area DA including the first to third sub-pixel areas SPXA1 to SPXA3. FIGS. 3 and 4 are schematic cross-sectional views taken along line A-A' of FIG. 2. FIG. 5 is a schematic block diagram illustrating a connection structure for a sub-pixel including a light emitting element according to an embodiment. For example, FIG. 5 may illustrate an electrical connection structure including a pixel circuit PXC corresponding to each of the sub-pixels SPX. FIG. 6 is a schematic cross-sectional view illustrating a light emitting element and a capping layer according to an embodiment. FIG. 7 is a schematic block diagram illustrating an electrical path through which a cathode signal is supplied according to an embodiment. For example, FIG. 7 may schematically illustrate a position of configurations and an electrical connection relationship between the configurations based on the display area DA and the non-display area NDA. FIG. 8 is a schematic cross-sectional view illustrating a thickness relationship between a second power line and a cathode electrode according to an embodiment.

Referring to FIGS. 3 and 4, the display device DD may include a pixel circuit layer PCL and a light emitting element layer LEL.

The pixel circuit layer PCL may include a base layer BSL, a pixel circuit PXC, a first power line PL1, a second power line PL2, and a via layer VIA.

The base layer BSL may form a base on which the pixel circuit PXC, the first power line PL1, and the second power line PL2 configured to drive a light emitting element LD may be disposed. The pixel circuit PXC may be disposed on the base layer BSL and may be configured to drive the light emitting element LD. The pixel circuit layer PCL may include conductive layers and insulating layers, and the conductive layers may form the pixel circuit PXC, the first power line PL1, and the second power line PL2. The pixel circuit PXC may be included in a corresponding sub-pixel SPX.

The pixel circuit PXC may include one or more circuit elements. For example, the pixel circuit PXC may include three transistors and a storage capacitor. For example, the pixel circuit PXC may include a driving transistor, a switching transistor, and a storage capacitor. However, the disclosure is not necessarily limited thereto.

The pixel circuit PXC may include a first pixel circuit PXC1 configured to drive the first sub-pixel SPX1 and electrically connected to the light emitting element LD of the first sub-pixel SPX1, a second pixel circuit PXC2 configured to drive the second sub-pixel SPX2 and electrically connected to the light emitting element LD of the second sub-pixel SPX2, and a third pixel circuit PXC3 configured to drive the third sub-pixel SPX3 and electrically connected to the light emitting element LD of the third sub-pixel SPX3.

Referring to FIG. 5 together, the pixel circuit PXC may be electrically connected to a scan line SL and a data line DL. The scan line SL may supply a scan signal to the pixel circuit PXC, and according to an embodiment, the scan line SL may be electrically connected to a gate electrode of the switching transistor of the pixel circuit PXC. The light emitting element LD may be configured to emit light corresponding to a data signal provided from the data line DL.

The pixel circuit PXC may be electrically connected to the first power line PL1 and the second power line PL2. For example, an anode electrode AE of the light emitting element LD may be electrically connected to the pixel circuit PXC and the first power line PL1, and a cathode electrode CE of the light emitting element LD may be electrically connected to the second power line PL2. The first power line PL1 and the second power line PL2 may be disposed on the base layer BSL.

Power of the first power line PL1 and power of the second power line PL2 may have different potentials. For example, the power of the first power line PL1 may be high-potential pixel power receiving power from a first voltage potential VDD, and the power of the second power line PL2 may be low-potential pixel power receiving power from a second voltage potential VSS. A potential difference between the power of the first power line PL1 and the power of the second power line PL2 may be set to be equal to or greater than a threshold voltage of the light emitting elements LD.

The first power line PL1 may be electrically connected to the pixel circuit PXC (for example, the driving transistor). The second power line PL2 may be electrically connected to the cathode electrode CE of the light emitting element LD.

Each light emitting element LD may be electrically connected in a forward direction between the first power line PL1 and the second power line PL2 to form each effective light source. These effective light sources may be gathered together to configure the light emitting elements LD of the sub-pixel SPX.

The light emitting elements LD may emit light with a luminance corresponding to a driving current supplied through the pixel circuit PXC. During each frame period, the pixel circuit PXC may supply the driving current corresponding to the data signal to the light emitting element LD. The light emitting element LD may emit light with a luminance corresponding to the current flowing therein.

The first power line PL1 and the second power line PL2 may be patterned on the base layer BSL. According to an embodiment, the first power line PL1 may be patterned in the sub-pixel areas SPXA and areas adjacent thereto. The second power line PL2 may be patterned in the sub-pixel areas SPXA and areas adjacent thereto. For convenience of description, the first and second power lines PL1 and PL2 corresponding to each of the first to third sub-pixels SPX1 to SPX3 may be shown separately, but according to an embodiment, the first power lines PL1 corresponding to each of the first to third sub-pixels SPX1 to SPX3 may be electrically connected to each other and may be formed integrally. The second power lines PL2 corresponding to each of the first to third sub-pixels SPX1 to SPX3 may be electrically connected to each other and may be formed integrally.

According to an embodiment, the first power line PL1 and the second power line PL2 may include a conductive material. For example, the first power line PL1 and the second power line PL2 may include one or more of a group of gold (Au), silver (Ag), aluminum (Al), molybdenum (Mo), chromium (Cr), titanium (Ti), nickel (Ni), neodymium (Nd), copper (Cu), and platinum (Pt). However, the disclosure is not limited thereto.

The first power line PL1 may be electrically connected to the pixel circuit PXC. The second power line PL2 may be electrically connected to the first line L1.

The via layer VIA may form an upper structure of the pixel circuit layer PCL. The via layer VIA may be a planarization layer. The via layer VIA may cover the pixel circuit PXC, the first power line PL1, and the second power line PL2.

At least a portion of a contact member CNP that electrically connects the second power line PL2 and the cathode electrode CE may be formed in the via layer VIA. At least a portion of a contact portion CNT that electrically connects the pixel circuit PXC and the anode electrode AE may be formed in the via layer VIA.

The via layer VIA may include an organic material. For example, the organic material may include one or more of a group of acrylic resin, epoxy resin, phenol resin, polyamide resin, and polyimide resin. However, the disclosure is not limited thereto.

The light emitting element layer LEL may be disposed on the pixel circuit layer PCL. According to an embodiment, the light emitting element layer LEL may include the light emitting element LD, the pixel defining layer PDL, a capping layer CPL, the line L, and an encapsulation layer TFE. According to an embodiment (refer to FIG. 4), the light emitting element layer LEL may further include a void VO.

The light emitting element LD may include an organic light emitting diode (OLED) including an organic material. However, the disclosure is not limited thereto. According to an embodiment, the light emitting element LD may be a quantum dot light emitting element including an inorganic material.

Referring to FIG. 6 together, the light emitting element LD may include the anode electrode AE, a light emitting part EL, and the cathode electrode CE. The light emitting element LD may include a first light emitting element LD1 for forming the first sub-pixel SPX1, a second light emitting element LD2 for forming the second sub-pixel SPX2, and a third light emitting element LD3 for forming the third sub-pixel SPX3.

According to an embodiment, the first to third light emitting elements LD1 to LD3 may emit light of different colors. For example, the first light emitting element LD1 may emit light of a first color. The second light emitting element LD2 may emit light of a second color. The third light emitting element LD3 may emit light of a third color.

The anode electrode AE may be disposed on the pixel circuit layer PCL (for example, the via layer VIA). The anode electrode AE may be electrically connected to the pixel circuit PXC through the contact portion CNT. The anode electrode AE may include a first anode electrode AE1 electrically connected to the first pixel circuit PXC1, a second anode electrode AE2 electrically connected to the second pixel circuit PXC2, and a third anode electrode AE3 electrically connected to the third pixel circuit PXC3.

The anode electrodes AE may include various conductive materials. For example, the anode electrodes AE may include a transparent conductive material. For example, the anode electrodes AE may include at least one of transparent conductive materials such as indium tin oxide (ITO), indium zinc oxide (IZO), zinc oxide ($ZnO_x$), indium gallium zinc oxide (IGZO), and indium tin zinc oxide (ITZO). The anode electrodes AE may include an opaque conductive material that may reflect light. For example, anode electrodes AE may include one or more of a group of titanium nitride (TiN), silver (Ag), and aluminum (Al).

The light emitting part EL may be disposed on the anode electrode AE. The light emitting part EL may include a first light emitting part EL1 disposed on the first anode electrode AE1 and for forming the first sub-pixel SPX1, a second light emitting part EL2 disposed on the second anode electrode AE2 and for forming the second sub-pixel SPX2, and a third light emitting part EL3 disposed on the third anode electrode AE3 and for forming the third sub-pixel SPX3.

The light emitting part EL may include a multilayer structure. The light emitting part EL may include a light emitting layer EML configured to generate light, an electron transport layer ETU configured to transport an electron, and a hole transport layer HTU configured to transport a hole. The light emitting layer EL may include various organic materials, and according to an embodiment, the light emitting layer EL may further include a metal-containing compound, an inorganic material such as a quantum dot, or the like.

The hole transport layer HTU may include a multilayer structure having multiple layers respectively including different materials. As an example, the hole transport layer HTU may include at least one of a hole injection layer and a hole transport layer, and according to an embodiment, the hole transport layer HTU may further include a light emitting auxiliary layer, an electron blocking layer, and the like.

The hole injection layer may be a layer that performs or improves a hole injection function from the anode electrode AE to another adjacent organic layer. The hole transport layer may be a layer that provides a hole to the light emitting layer EML. The light emitting auxiliary layer may be a layer that compensates for a resonance distance based on a wavelength of light provided by the light emitting layer EML. The electron blocking layer may be a layer that prevents an electron from being injected from the electron transport layer ETU to reduce the number of carriers (for example, holes or electrons) leaving the light emitting layer EML. For example, the hole transport layer HTU may have a multilayer structure such as hole injection layer/hole transport layer, hole injection layer/hole transport layer/light emitting auxiliary layer, hole injection layer/light emitting auxiliary layer, hole transport layer/light emitting auxiliary layer, electron blocking layer/hole injection layer/hole transport layer, hole transport layers disposed sequentially and including different materials, or hole injection layer/hole transport layer/electron blocking layer. However, the disclosure is not limited thereto.

According to an embodiment, the hole transport layer HTU may include various hole transport organic materials. However, the disclosure is not particularly limited.

The light emitting layer EML may be disposed between the hole transport layer HTU and the electron transport layer ETU. The light emitting layer EML may include a material that may emit light of a color. The emitting layer EML may include a host and a dopant. The host of the light emitting layer EML may be a light emitting material that may capture carriers (electrons and holes) for light generation, and may induce an exciton to be efficiently generated. The dopant may include a phosphorescent dopant or a fluorescent dopant. According to an embodiment, an example of the dopant may not be particularly limited. According to an embodiment, the dopant may include an organic material or may include a metal complex.

The electron transport layer ETU may include a multilayer structure having multiple layers respectively including different materials. The electron transport layer ETU may include at least one of an electron injection layer and an electron transport layer, and according to an embodiment, the electron transport layer ETU may further include an electron buffer layer, a hole blocking layer, and the like.

The electron injection layer may be a layer that performs or improves an electron injection function from the cathode electrode CE to another adjacent organic layer. The electron transport layer may be a layer that provides a provided electron to the light emitting layer EML. The hole blocking layer may be a layer that prevents a hole from being injected from the hole transport layer HTU to reduce the number of carriers leaving the light emitting layer EML.

For example, the electron transport layer ETU may have a multilayer structure such as electron transport layer/electron injection layer, hole blocking layer/electron transport layer/electron injection layer, electron control layer/electron transport layer/electron injection layer, or buffer layer/electron transport layer/electron injection layer. However, the disclosure is not limited thereto.

According to an embodiment, the electron transport layer ETU may include various electron transport compounds. For example, the electron transport layer ETU may include a metal-free organic material, or may include a metal-containing organic material or various metal materials (for example, an alkaline earth metal, a rare earth metal, and/or the like). However, the disclosure is not limited thereto.

The cathode electrode CE may be disposed on the light emitting part EL, and at least a portion of the cathode electrode CE may be disposed on the pixel defining layer PDL. According to an embodiment, the cathode electrode CE may be disposed in an area adjacent to the first line L1. The cathode electrode CE may cover the first line L1 and may not cover the second line L2. In a plan view, the cathode electrode CE may overlap the first line L1 and may not overlap the second line L2. According to an embodiment, the cathode electrode CE may contact the first line L1. According to an embodiment, the cathode electrode CE may not contact the second line L2.

The cathode electrode CE may contact the pixel defining layer PDL in an area adjacent to the first line L1. According to an embodiment, joule heating may be formed through the first line L1, and thus layers adjacent to the first line L1 may be removed. Thereafter, the cathode electrode CE may be formed, and thus the exposed pixel defining layer PDL and the cathode electrode CE may be directly adjacent to each other in the area adjacent to the first line L1.

The cathode electrode CE may be electrically connected to the first line L1. The first line L1 may be electrically connected to the second power line PL2 through the contact portion CNP, and the cathode electrode CE may receive a cathode voltage through the first line L1. According to an embodiment, the contact portion CNP may pass through the pixel defining layer PDL and the via layer VIA, and according to an embodiment, the contact portion CNP may pass through insulating layer(s) on the second power line PL2.

According to an embodiment, the cathode electrodes CE for each of the sub-pixels SPX may be spaced apart from each other. The cathode electrode CE may include a first cathode electrode CE1 included in the first sub-pixel SPX1 and electrically connected to the first light emitting part EL1, a second cathode electrode CE2 included in the second sub-pixel SPX2 and electrically connected to the second light emitting part EL2, and a third cathode electrode CE3 included in the third sub-pixel SPX3 and electrically connected to the third light emitting part EL3. According to an embodiment, the first to third cathode electrodes CE1 to CE3 may be physically separated from each other.

The cathode electrode CE may be a thin metal layer having a thickness sufficient to transmit light emitted from the light emitting part EL. The cathode electrode CE may be formed of a metal material or a transparent conductive material to have a relatively thin thickness. In embodiments, the cathode electrode CE may include at least one of various transparent conductive materials including indium tin oxide, indium zinc oxide, indium tin zinc oxide, aluminum zinc oxide, gallium zinc oxide, zinc tin oxide, or gallium tin oxide. In other embodiments, the cathode electrode CE may include at least one of silver (Ag), magnesium (Mg), and a mixture thereof. However, a material of the cathode electrode CE is not limited thereto.

In each of the sub-pixels SPX, holes injected from the anode electrode AE and electrons injected from the cathode electrode CE may be transported into the light emitting part EL to form excitons, and light may be generated in case that the excitons may be transited from an excited state to a ground state. The luminance of the light may be determined according to an amount of current flowing through the light emitting part EL. According to a configuration of the light emitting part EL, a wavelength range of the generated light may be determined.

Since the cathode electrode CE has a relatively thin thickness, the cathode electrode CE may have a relatively high resistance. Experimentally, in case that a voltage is applied through a conductive structure with a high resistance, a voltage drop risk may occur, and thus supply of an intended electrical signal to the light emitting element LD may be difficult.

Referring to FIGS. 7 and 8 together, an electrical path through which the cathode voltage may be supplied according to an embodiment may be defined so that the voltage drop risk may be reduced.

According to an embodiment, the cathode voltage may be supplied generally through the second power line PL2, which has a generally thick thickness, and may be electrically connected to the cathode electrode CE through the contact member CNP in an area adjacent to an object cathode electrode CE to which the cathode voltage may be supplied.

The second power line PL2 may have a power thickness T_PL. The cathode electrodes CE may have a cathode thickness T_CE. According to an embodiment, the cathode thickness T_CE may be thinner than the power source thickness T_PL. For example, the power thickness T_PL may range from 2000 ÅÅ to 9000 ÅÅ. The cathode thickness T_CE may range from 50 Å to 200 Å. However, the disclosure is not limited thereto. According to an embodiment, since the cathode thickness T_CE may be thinner than the power supply thickness T_PL, the cathode electrode CE may have a resistance greater than that of the second power line PL2.

The second power line PL2 may be electrically connected to the second voltage potential VSS in the non-display area NDA. The second power line PL2 may be electrically connected to the cathode electrode CE in the display area DA. The first cathode electrode CE1 may be electrically connected to a portion (for example, the first portion) of the second power line PL2 through the contact portion CNP, the second cathode electrode CE2 may be electrically connected to another portion (for example, the second portion) of the second power line PL2 through the contact portion CNP, and the third cathode electrode CE3 may be electrically connected to still another portion (for example, the third portion) of the second power line PL2 through the contact portion CNP. The contact portions CNP may be disposed in the display area DA. In a plan view, the contact portions CNP may overlap the cathode electrode CE and may overlap the second power line PL2.

Accordingly, as described above, the path to which the cathode voltage may be applied may be generally defined in the second power line PL2 having a relatively small resistance, and the path to which the cathode voltage may be applied may be defined as a small portion in the cathode electrode CE having a relatively large resistance. Ultimately, the voltage drop risk to the cathode voltage may be substantially reduced.

The pixel defining layer PDL may cover at least a portion of the anode electrode AE. The pixel defining layer PDL may overlap at least a portion of the anode electrode AE in a plan view. The pixel defining layer PDL may form an opening, and the anode electrode AE may be exposed in the opening.

The pixel defining layer PDL may form a base on which the line L may be disposed. For example, the pixel defining layer PDL may be in contact with the line L.

The pixel defining layer PDL may include an inorganic material. For example, the pixel defining layer PDL may include silicon oxide ($SiO_x$) and silicon nitride ($SiN_x$). However, the disclosure is not limited thereto.

The pixel defining layer PDL may include a multi-layer structure. For example, the pixel defining layer PDL may include a multilayer structure in which silicon oxide ($SiO_x$) and silicon nitride ($SiN_x$) may be alternately disposed.

The capping layer CPL may be disposed on the light emitting element LD (for example, the cathode electrode CE). The capping layer CPL may passivate the first to third light emitting elements LD1 to LD3.

The capping layer CPL may include a first capping layer CPL1 and a second capping layer CPL2. The first capping layer CPL1 and the second capping layer CPL2 may include an inorganic material. For example, the first capping layer CPL1 and the second capping layer CPL2 may independently include one or more of a group of silicon nitride ($SiN_x$), aluminum nitride ($AlN_x$), titanium nitride ($TiN_x$), silicon oxide ($SiO_x$), aluminum oxide ($Al_xO_y$), titanium oxide ($TiO_x$), silicon oxycarbide ($SiO_xC_y$), and silicon oxynitride ($SiO_xN_y$). However, the disclosure is not limited thereto.

The first capping layer CPL1 may be disposed on each of the first to third light emitting elements LD1 to LD3. The first capping layer CPL1 may passivate each of the first to third light emitting elements LD1 to LD3 in a process of sequentially manufacturing the first to third light emitting elements LD1 to LD3, to reduce a risk of occurrence of a defect. The first capping layer CPL1 may cover the first line L1 and may not cover the second line L2. In a plan view, the first capping layer CPL1 may overlap the first line L1 and may not overlap the second line L2.

The second capping layer CPL2 may be disposed on each of the first to third light emitting elements LD1 to LD3 and may be further disposed outside each of the first to third light emitting elements LD1 to LD3. The second capping layer CPL2 may cover the first line L1 and cover the second line L2. According to an embodiment, the second capping layer CPL2 may be directly adjacent to the second line L2. The second capping layer CPL2 may cover a side surface of the light emitting part EL, the cathode electrode CE, and the first capping layer CPL1.

The second capping layer CPL2 may seal the light emitting elements LD and reduce a risk such as moisture. The second capping layer CPL2 may physically contact the pixel defining layer PDL in an area adjacent to the second line L2. Joule heating may be formed through the second line L2, and thus layers adjacent to the second line L2 may be removed. Thereafter, the second capping layer CPL2 may be formed, and thus the exposed pixel defining layer PDL and the second capping layer CPL2 may be directly adjacent to each other in the area adjacent to the second line L2.

As described above, since the second capping layer CPL2 may include an inorganic material and the pixel defining layer PDL may include an inorganic material, the inorganic material and the inorganic material may be directly adjacent to each other, and thus an inorganic encapsulation structure may be formed around the light emitting element LD. The inorganic encapsulation structure may prevent a moisture permeation issue that may occur in the light emitting element LD, and thus a lifespan and an element characteristic of the light emitting element LD may be improved.

The line L may be disposed on the pixel defining layer PDL. According to an embodiment, the line L may be directly adjacent to the pixel defining layer PDL. Each of the first line L1 and the second line L2 may be disposed adjacent to the first to third sub-pixel areas SPXA1 to SPXA3.

The line L may be a resistive conductive structure to form joule heating. According to an embodiment, when a pulse voltage is supplied to the line L, heat may be applied to an area adjacent to the line L. The applied heat may remove at least a portion of layers (for example, layers including an organic material) disposed around the line L. According to an embodiment, a magnitude of the voltage supplied to the line L and a time in case that the voltage is supplied may be adjusted, and thus an amount by which the layers disposed around the line L may be removed.

According to an embodiment, the line L may include a conductive material having a resistance. The line L may include a metal material suitable for forming joule heating. For example, the line L may include a conductive material having an electrical conductivity less than about $4.0\times10^7$ (S/m) (Siemens per meter) at about 20° C. Accordingly, the line L may have a characteristic suitable for forming joule heating. For example, the line L may include aluminum (Al), and the line L may include molybdenum (Mo). According to an embodiment, since a range in which joule heating may be spread may be adjusted based on an intensity of the voltage supplied to the line L and a voltage supply time, even in a case where a structure of the display device DD (for example, the sub-pixel SPX) may be miniaturized, the display device DD with high-resolution display quality may be provided.

Since the line L may form joule heating during a manufacturing process of the display device DD, the line L may expose the pixel defining layer PDL in an area adjacent to the line L. The cathode electrode CE may be disposed on the first line L1. The second capping layer CPL2 may be disposed on the second line L2.

As described above, since the first line L1 may form a closed-loop structure, the light emitting part EL may be disposed in the area surrounded by the first line L1, and may include an edge portion on an inside of the first line L1. Since the second line L2 may form a closed-loop structure, the light emitting element LD may be disposed in the area surrounded by the second line L2, and may include an edge portion on an inside of the second line L2.

The first line L1 may include a (1-1)-th line portion L1-1 and a (1-2)-th line portion L1-2. The second line L2 may include a (2-1)-th line portion L2-1 and a (2-2)-th line portion L2-2. The (1-1)-th line portion L1-1 may be disposed on a first side of the light emitting part EL and may be disposed between the (2-1)-th line portion L2-1 and the light emitting part EL. The (1-2)-th line portion L1-2 may be disposed on a second side of the light emitting part EL and may be disposed between the (2-2)-th line portion L2-2 and the light emitting part EL.

According to an embodiment (refer to FIG. 3), a void VO may be further formed in the area adjacent to the second line L2. The void VO may be disposed between the first line L1 and the second line L2. The void VO may be directly formed on the pixel defining layer PDL. The void VO may be surrounded by a layer formed in a same process as the cathode electrode CE, the first capping layer CPL1, and the light emitting part EL. The void VO may be an air gap.

The encapsulation layer TFE may be disposed on the light emitting element LD and the capping layer CPL. The encapsulation layer TFE may remove a step formed by the light emitting elements LD. The encapsulation layer TFE may form an outer layer of the light emitting element layer LEL.

The encapsulation layer TFE may include a multilayer structure. For example, the encapsulation layer TFE may include a first encapsulation layer TFE1, a second encapsulation layer TFE2, and a third encapsulation layer TFE3. According to an embodiment, the first encapsulation layer TFE1 may include an inorganic material, the second encapsulation layer TFE2 may include an organic material, and the third encapsulation layer TFE3 may include an inorganic material. However, the disclosure is not limited thereto.

With reference to FIGS. 9 to 25, a method of manufacturing the display device DD according to an embodiment is described. A content that may overlap the above-described content is briefly described or is not refuted.

Figure 9:
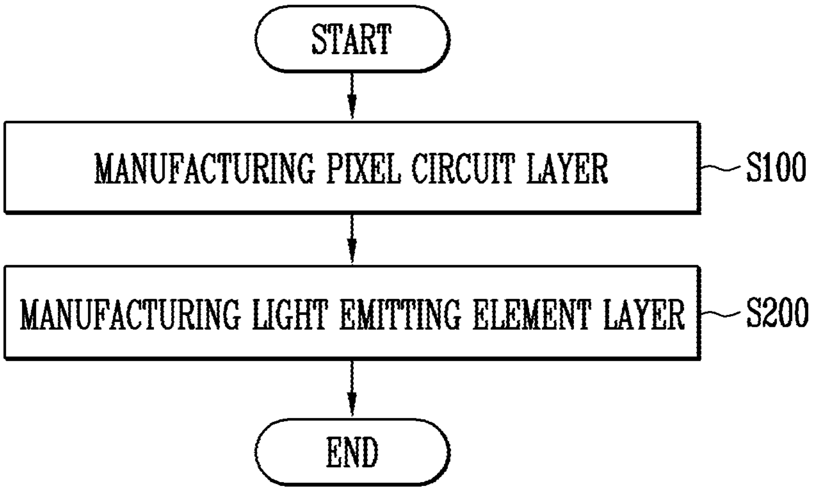
FIG. 9 is a flowchart illustrating a method of manufacturing a display device according to an embodiment.
Figure 10:
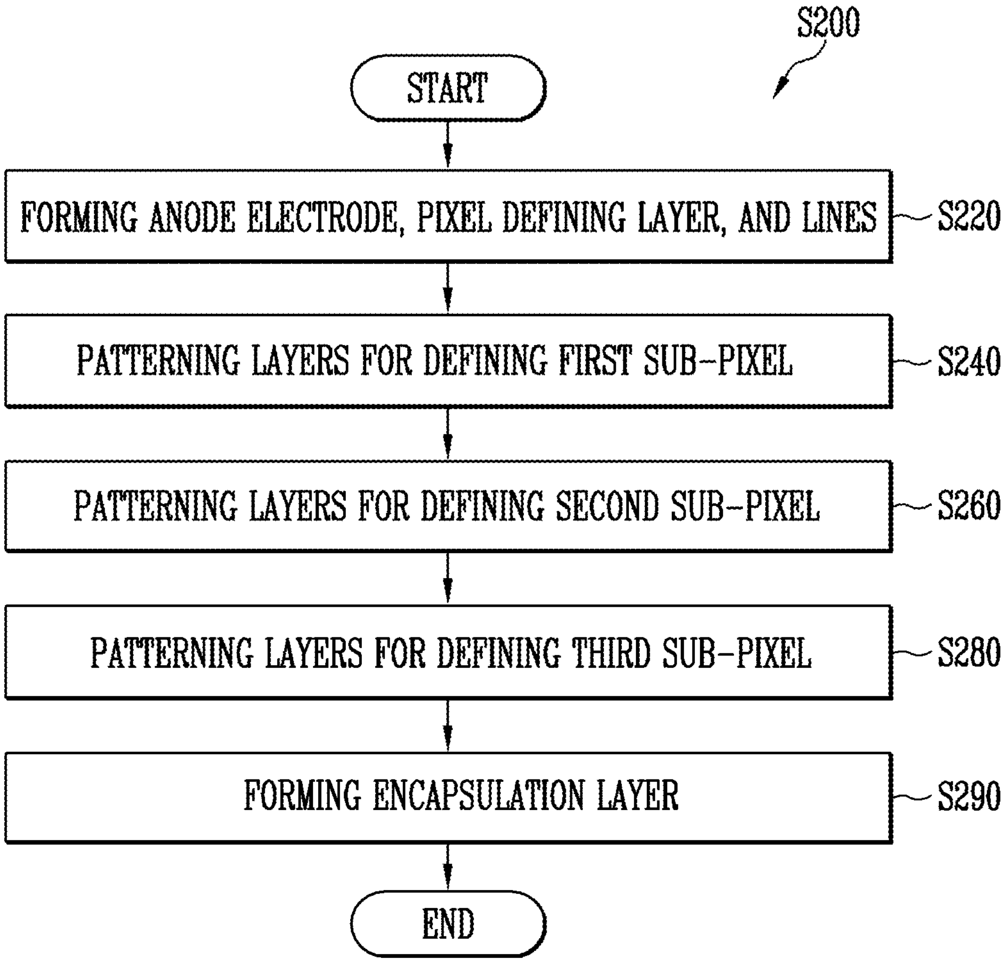
FIG. 10 is a flowchart illustrating a step of manufacturing a light emitting element layer according to an embodiment.
Figure 11:
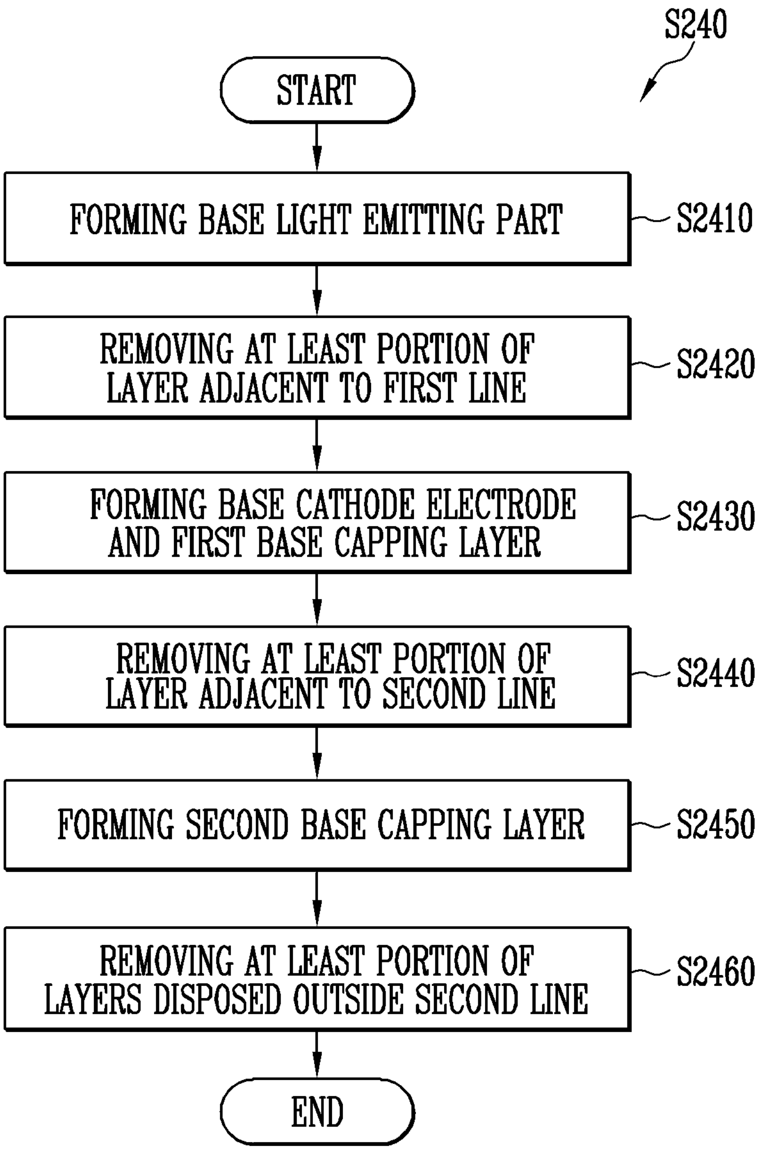
FIG. 11 is a flowchart illustrating a step of patterning a sub-pixel.

FIG. 9 is a flowchart illustrating a method of manufacturing a display device according to an embodiment. FIG. 10 is a flowchart illustrating a step of manufacturing a light emitting element layer according to an embodiment. FIG. 11 is a flowchart illustrating a step of patterning a sub-pixel.

Figure 19:
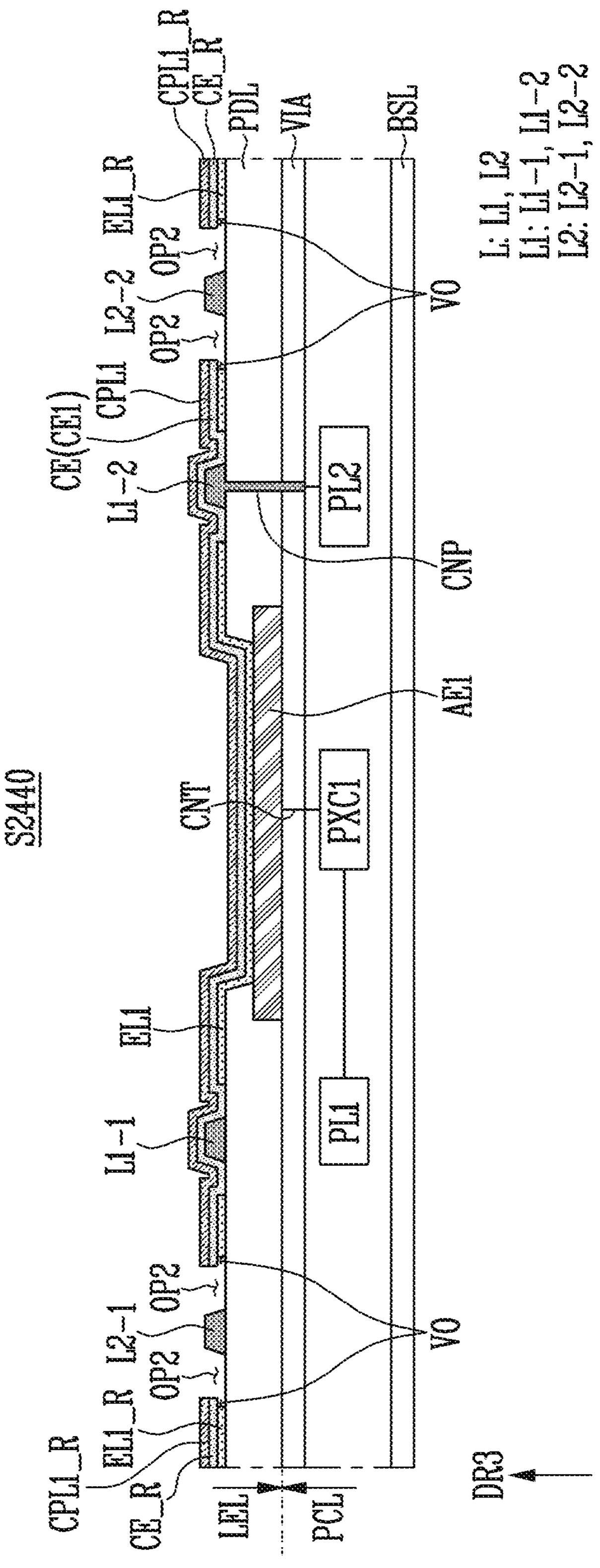
Figure 20:
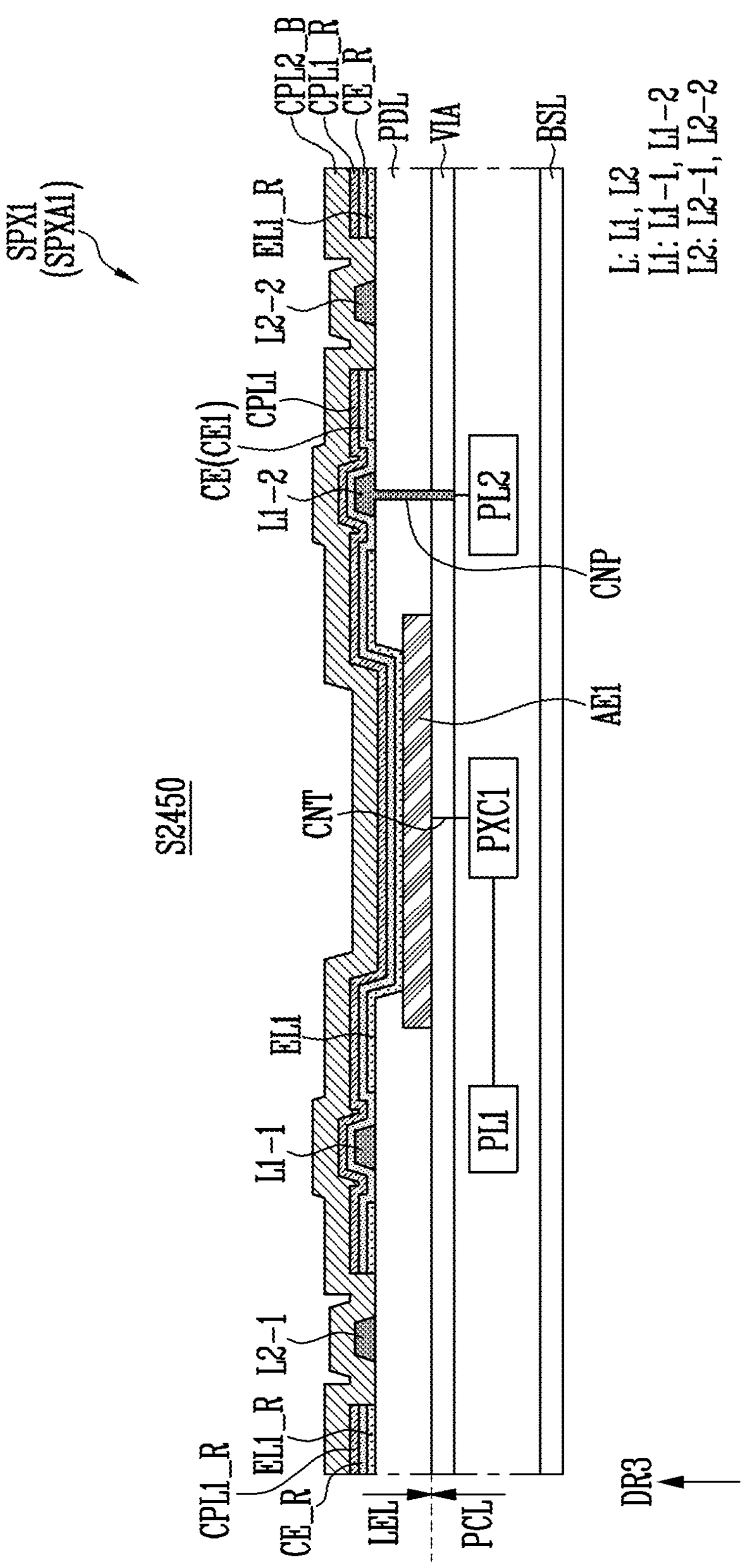
Figure 21:
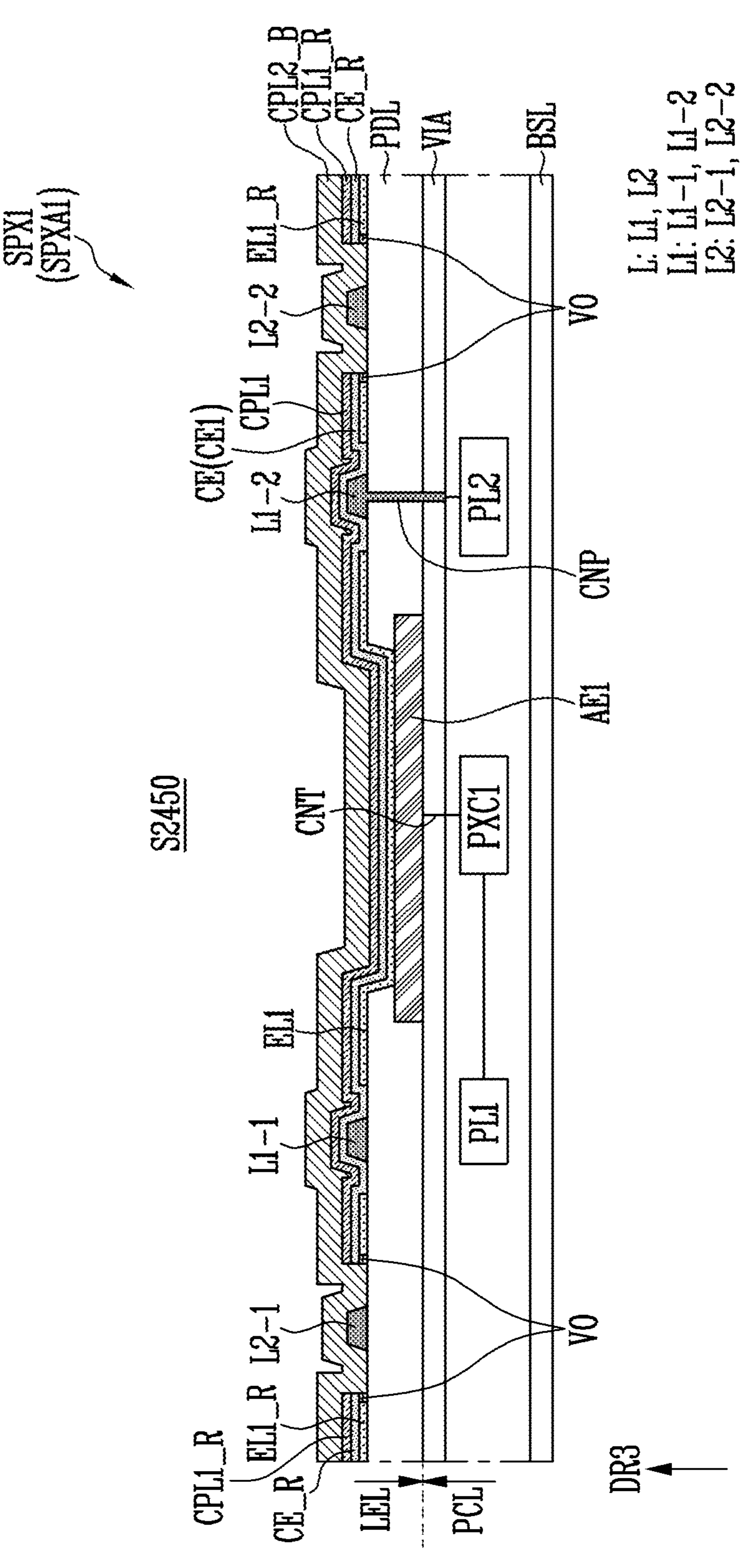
Figure 22:
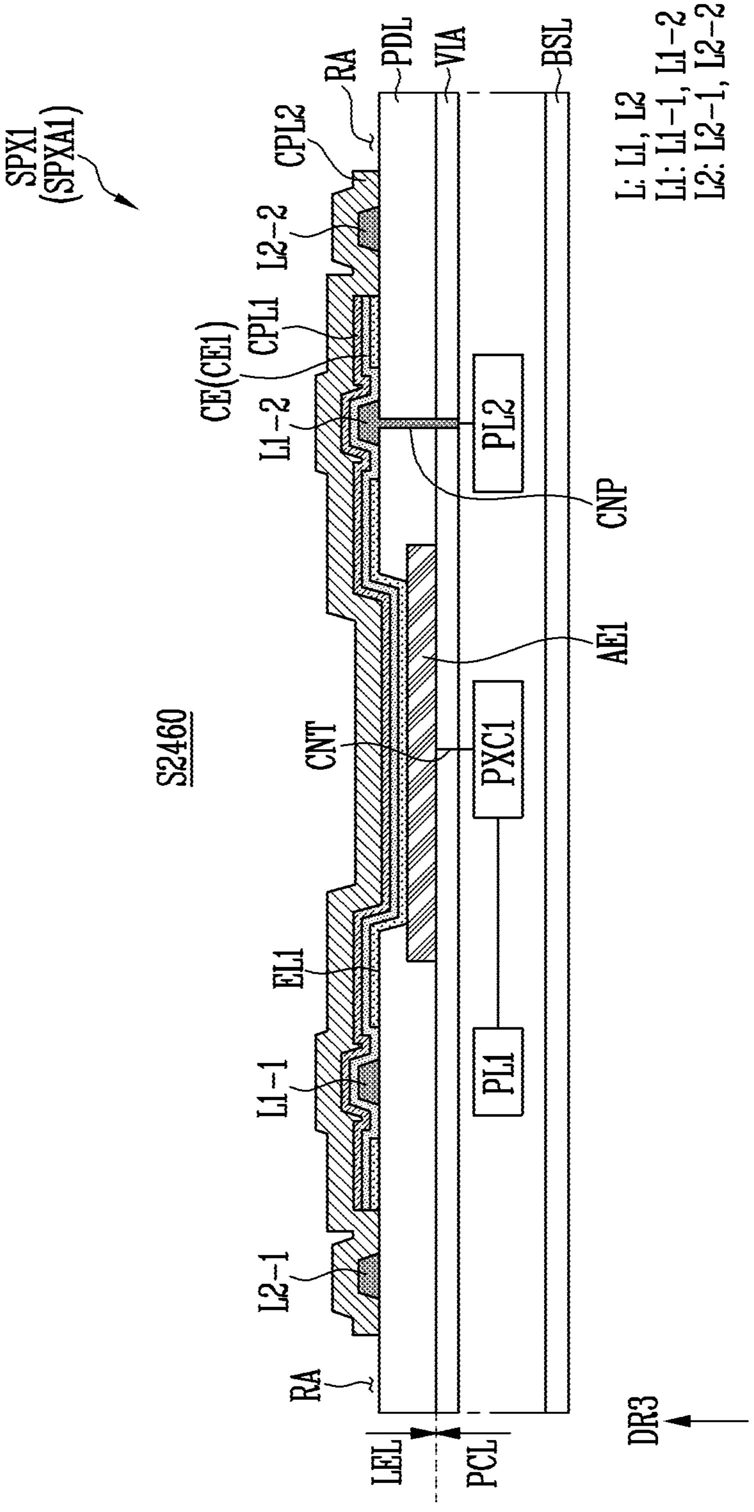
Figure 23:
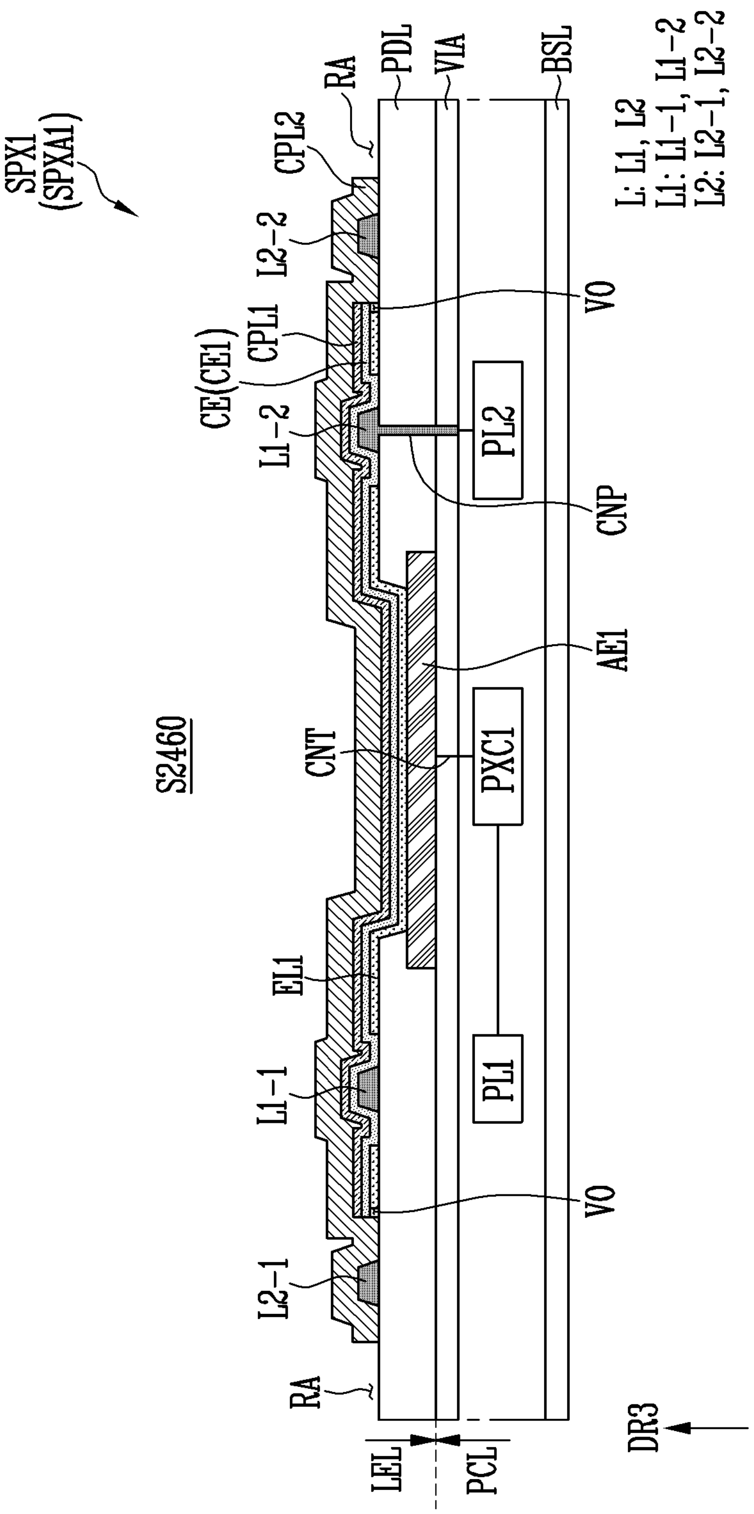

FIGS. 12 to 25 are schematic cross-sectional views for each process step illustrating a method of manufacturing a display device according to an embodiment. For convenience of description, FIGS. 12, 13, 24, and 25 show a schematic cross-sectional structure (for example, a partial cross-sectional structure of the display area DA), and FIGS. 14 to 23 show a schematic cross-sectional structure based on the first sub-pixel SPX1 among the sub-pixels SPX. According to an embodiment, FIGS. 19, 21, and 23 show an embodiment in which the display device DD described above with reference to FIG. 4 includes the void VO.

Referring to FIG. 9, a method of manufacturing a display device according to an embodiment may include manufacturing a pixel circuit layer (S100) and manufacturing a light emitting element layer (S200).

Referring to FIG. 10, manufacturing the light emitting element layer (S200) may include forming an anode electrode, a pixel defining layer, and lines (S220), patterning layers for defining a first sub-pixel (S240), patterning layers for defining a second sub-pixel (S260), patterning layers for defining a third sub-pixel (S280), and forming an encapsulation layer (S290).

Referring to FIG. 11, patterning the layers for defining the first sub-pixel (S240) may include forming a base light emitting part (S2410), removing at least a portion of a layer adjacent to a first line (S2420), forming a base cathode electrode and a first base capping layer (S2430), removing at least a portion of a layer adjacent to a second line (S2440), forming a second base capping layer (S2450), and removing at least a portion of layers disposed outside the second line (S2460).

Figure 12:
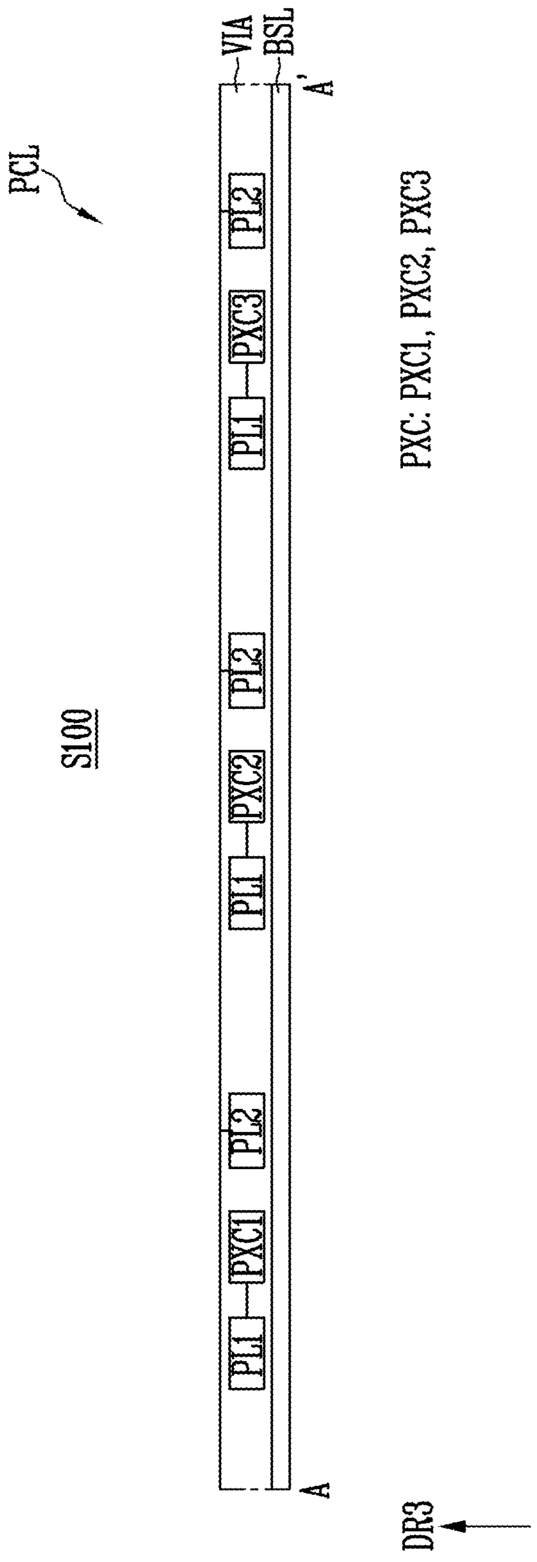
FIGS. 12 to 25 are schematic cross-sectional views for each process step illustrating a method of manufacturing a display device according to an embodiment.
Figure 13:
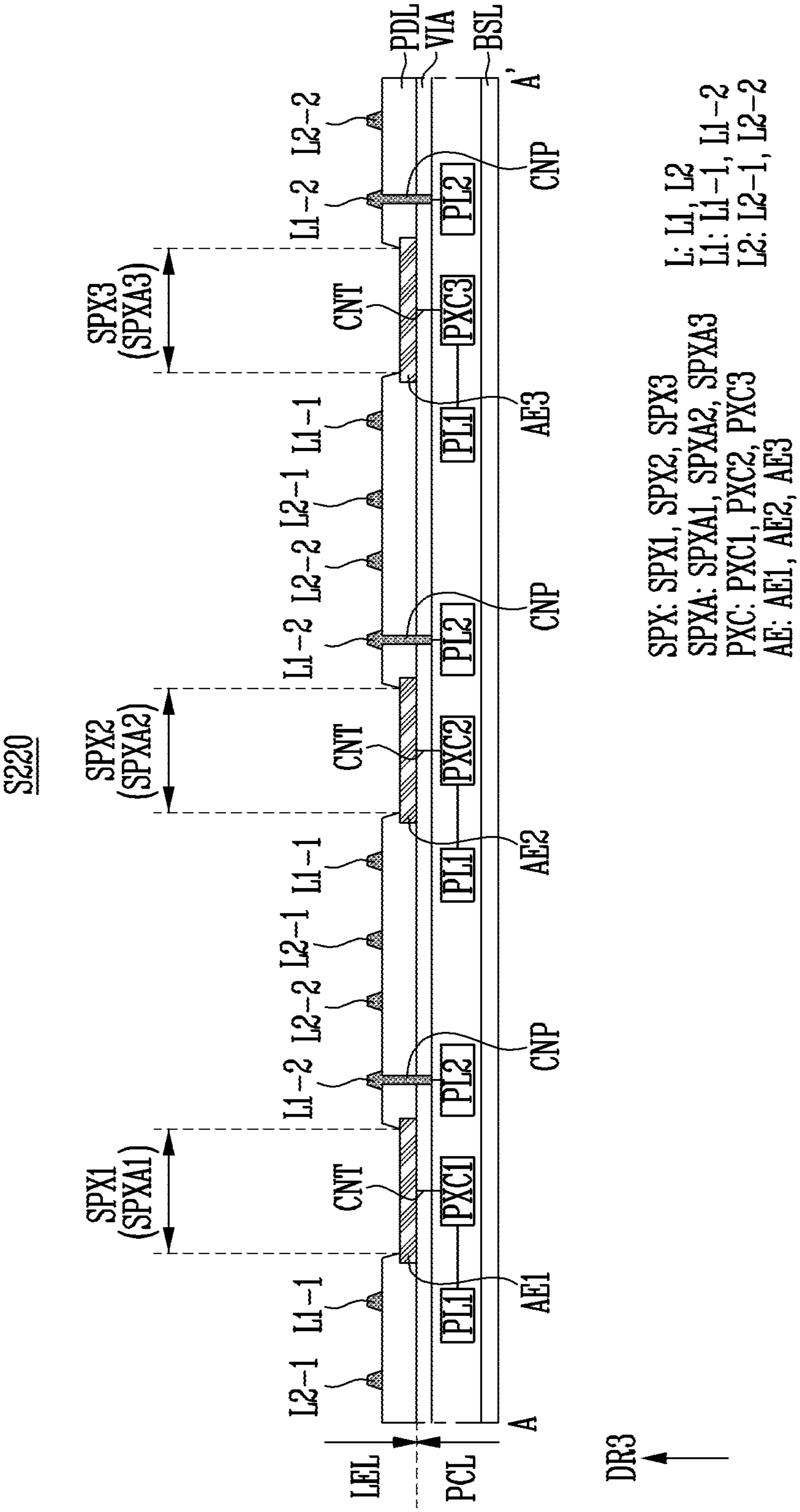
Figure 14:
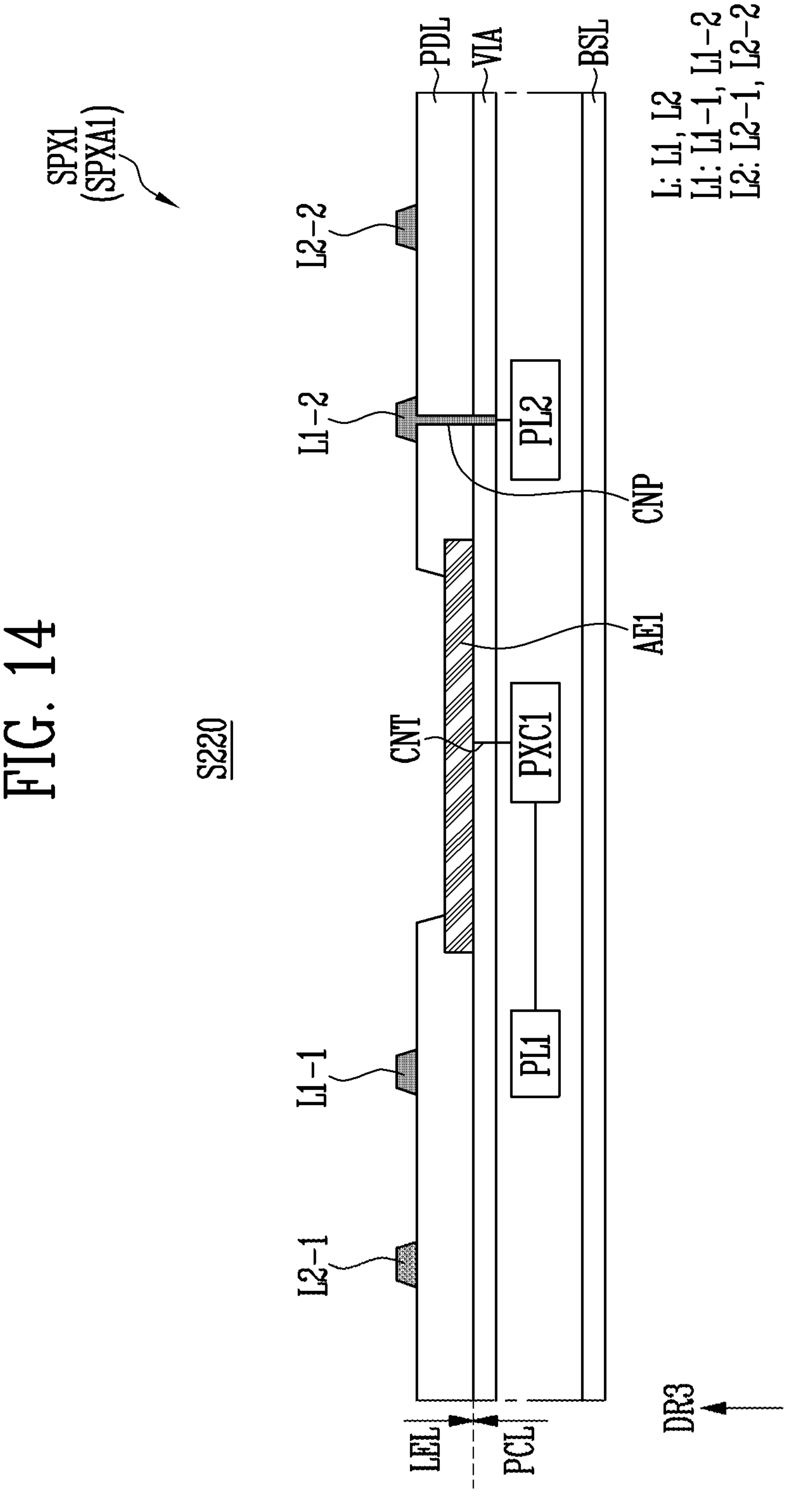
Figure 15:
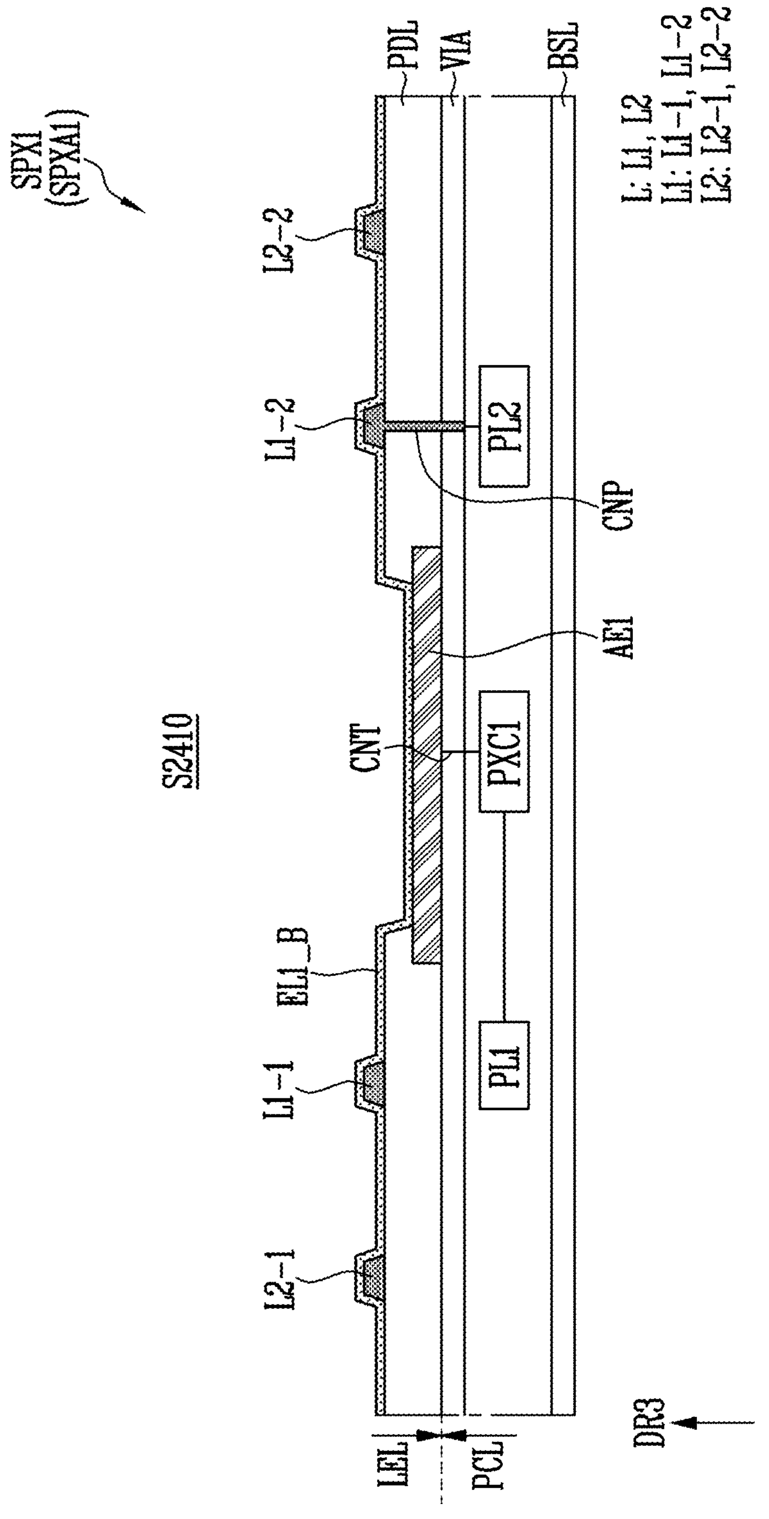
Figure 16:
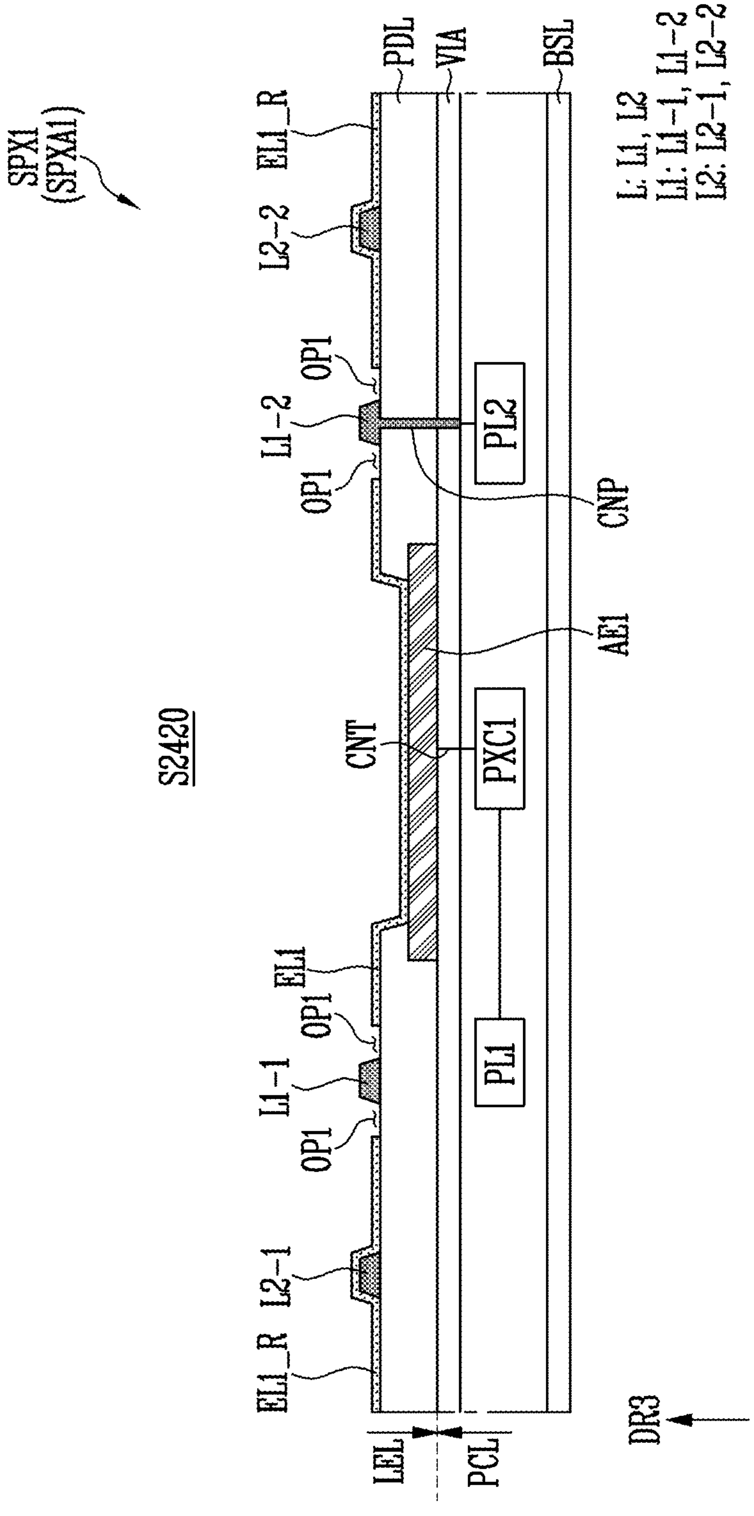
Figure 17:
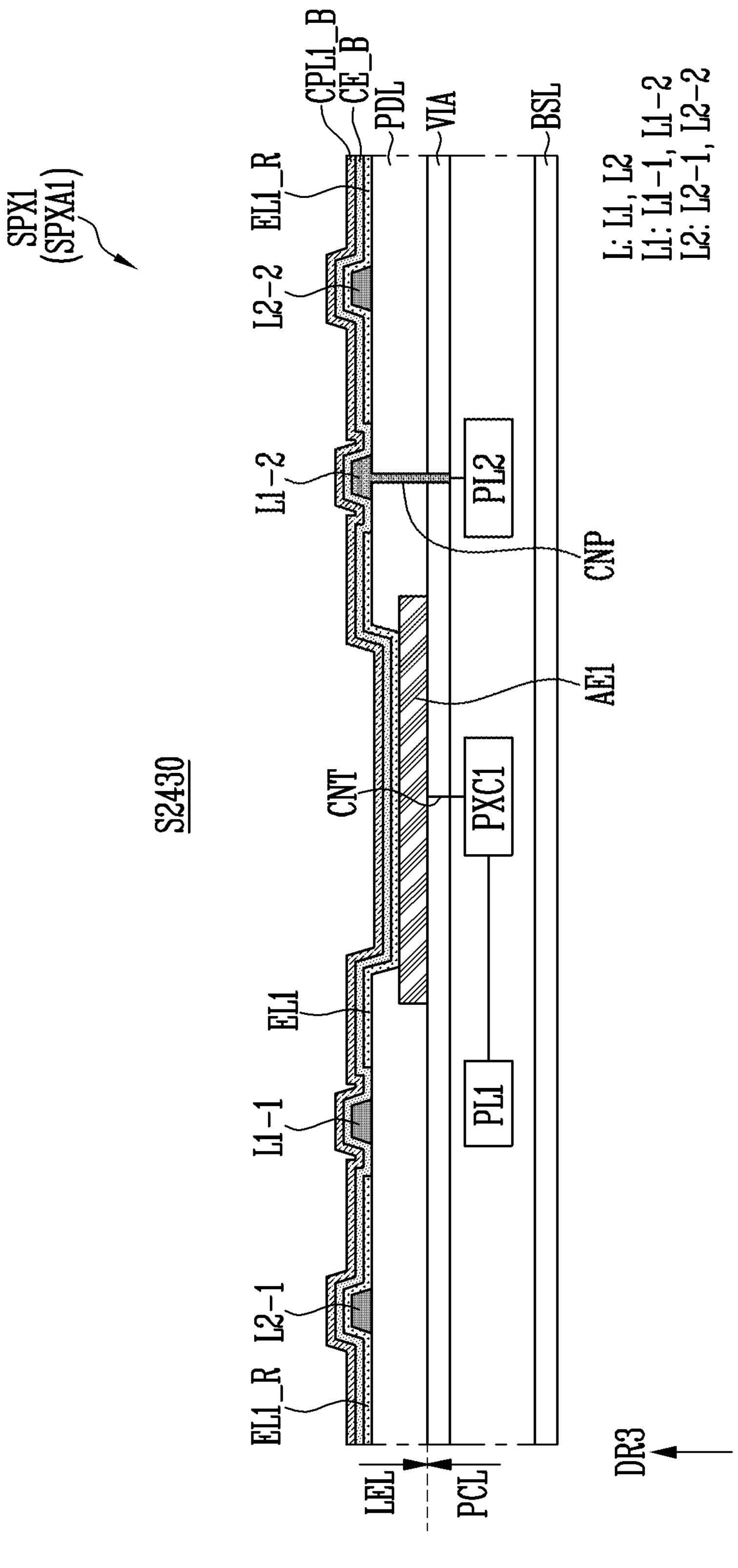
Figure 18:
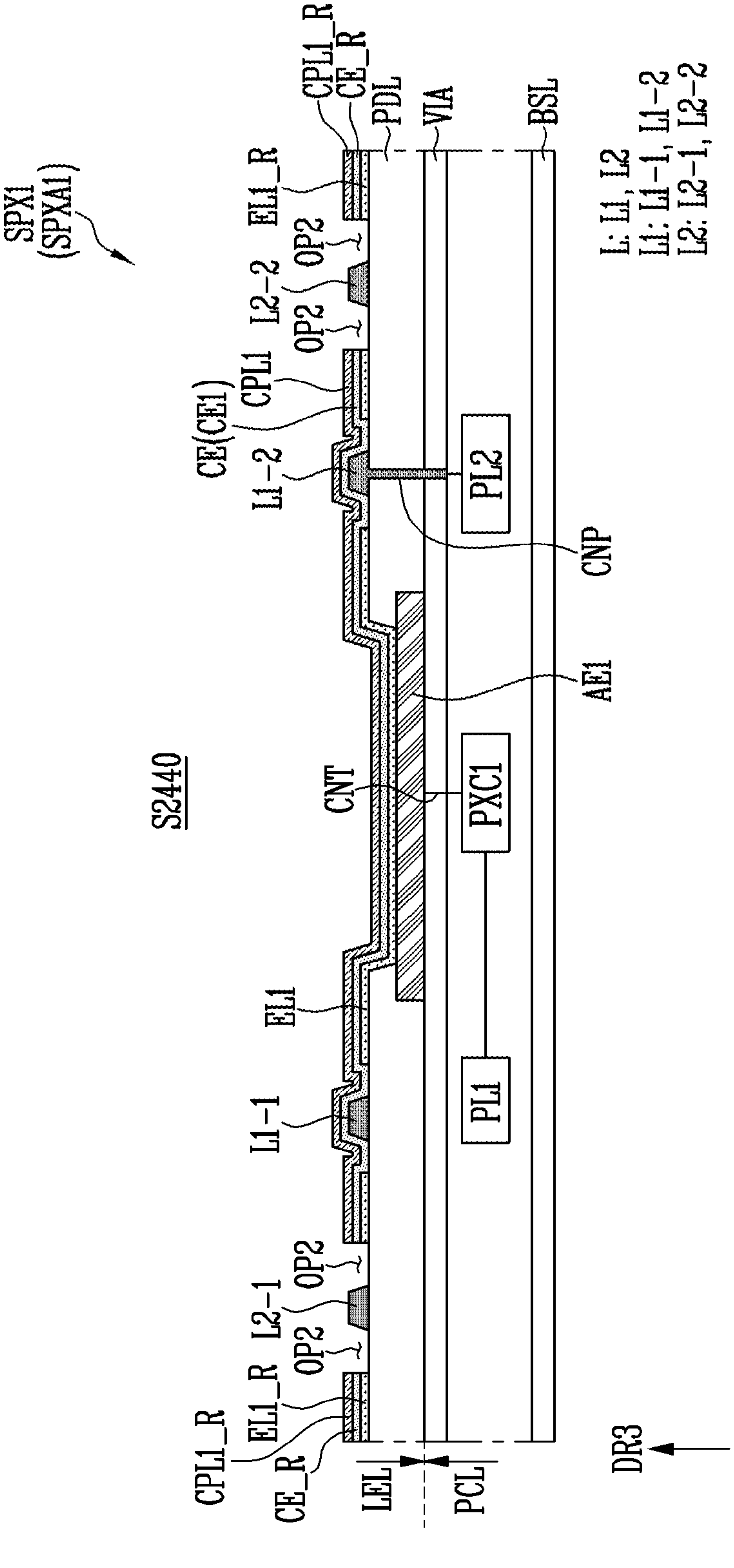

Referring to FIGS. 9 and 12, in manufacturing the pixel circuit layer (S100), layers forming the pixel circuit layer PCL on the base layer BSL may be patterned.

In step S100, the pixel circuits PXC, the first power line PL1, and the second power line PL2 may be patterned on the base layer BSL, and the via layer VIA may be formed on the pixel circuits PXC, the first power line PL1, and the second power line PL2.

In step S100, the first power line PL1 and the pixel circuit PXC may be electrically connected, and according to an embodiment, a contact hole exposing the second power line PL2 and for forming the contact member CNP in a subsequent process may be formed.

According to an embodiment, a conductive layer or an insulating layer on the base layer BSL may be formed based on a typical process for manufacturing a semiconductor device. For example, the conductive layer or the insulating layer on the base layer BSL may be formed by a photolithography process, may be etched by various methods (wet etching, dry etching, and the like), and may be deposited by various methods (sputtering, chemical vapor etching, and the like). The disclosure is not necessarily limited to a particular example.

Referring to FIGS. 9, 10, 13, and 14, in forming the anode electrode, the pixel defining layer, and the lines (S220), the anode electrode AE may be patterned on the pixel circuit layer PCL (for example, the base layer BSL and the via layer VIA), the pixel defining layer PDL may be patterned adjacent to the anode electrode AE, and the lines L may be formed on the pixel defining layer PDL.

In step S220, the first to third anode electrodes AE1 to AE3 may be patterned in areas corresponding to the first to third sub-pixel areas SPXA1 to SPXA3 to be formed. The respective first to third anode electrodes AE1 to AE3 may be electrically connected to the first to third pixel circuits PXC1 to PXC3 through the contact portion CNT passing through the via layer VIA.

In step S220, the pixel defining layer PDL may be patterned to overlap an area adjacent to the first to third sub-pixel areas SPXA1 to SPXA3, may be patterned to cover the first to third anode electrodes AE1 to AE3, and may be patterned to expose at least a portion of the first to third anode electrodes AE1 to AE3.

In step S220, the lines L may be patterned on the pixel defining layer PDL, and thus the first and second lines L1 and L2 spaced apart from each other may be provided. For example, the (1-1)-th line L1-1, the (1-2)-th line L1-2, the (2-1)-th line L2-1, and the (2-2)-th line L2-2 may be formed in an area adjacent to the first sub-pixel SPXA1, the (1-1)-th line L1-1, the (1-2)-th line L1-2, the (2-1)-th line L2-1, and the (2-2)-th line L2-2 may be formed in an area adjacent to the second sub-pixel SPXA2, and the (1-1)-th line L1-1, the (1-2)-th line L1-2, the (2-1)-th line L2-1, and the (2-2)-th line L2-2 may be formed in an area adjacent to the third sub-pixel SPXA3.

In step S220, a contact member CNP of which at least a portion passes through the pixel defining layer PDL may be formed, and at least a portion of the first line L1 may be electrically connected to the second power line PL2. For example, the (1-2)-th line L1-2 adjacent to a side of each of the sub-pixel areas SPXA may be electrically connected to the second power line PL2 through the contact portion CNP. However, a portion of the first line L1 electrically connected to the contact portion CNP is not limited to the (1-2)-th line L1-2, and according to an embodiment, the contact portion CNP may be electrically connected to at least another portion of the first line L1.

The first to third light emitting parts EL1 to EL3 according to an embodiment may be manufactured without using a fine metal mask (FMM). According to an embodiment, the first to third light emitting parts EL1 to EL3 may be structures included in each of the sub-pixels SPX for emitting light of different colors, and the first to third light emitting parts EL1 to EL3 adjacent to each other may be required to be spaced apart from each other. According to an embodiment the first to third light emitting parts EL1 to EL3 may be provided separately from each other using joule heating formed by the line L.

According to an embodiment, after forming the anode electrode, the pixel defining layer, and the line (S220), layers for forming the sub-pixels SPX may be sequentially formed. Hereinafter, for convenience of description, a process of forming layers for forming the sub-pixel SPX in an order of the first sub-pixel SPX1, the second sub-pixel SPX2, and the third sub-pixel SPX3 may be described. However, the disclosure is not limited thereto.

Referring to FIGS. 9 to 11 and 15, in patterning the layers for defining the first sub-pixel (S240), forming a base light emitting part (S2410) may be performed.

In step S2410, a base light emitting part EL1_B may be formed in the display area DA. The base light emitting part EL1_B may be formed without using FMM. For example, the base light emitting part EL1_B may be entirely deposited (i.e., blanket deposited without being patterned) on the pixel circuit layer PCL. The base light emitting part EL1_B may cover the exposed anode electrode AE (for example, the first anode electrode AE1) and may cover the lines L. For example, the base light emitting part EL1_B may cover the first line L1 and the second line L2. The base light emitting part EL1_B may cover the pixel defining layer PDL, and the pixel defining layer PDL may not be exposed.

Referring to FIGS. 9 to 11 and 16, in patterning the layers for defining the first sub-pixel (S240), removing at least a portion of a layer adjacent to the first line (S2420) may be performed. The layer adjacent to the first line L1 removed in step S2420 may include the base light emitting part EL1_B, and after step S2420 may be performed, the layer adjacent to the first line L1 may include a remaining light emitting part EL1_R.

Step S2420 may be a step of separating the light emitting part EL for emitting light of a color from the light emitting part EL for emitting light of another color. As step S2420 is performed, the light emitting parts EL may be divided for each of the sub-pixels SPX, a leakage current may be prevented, and a risk that light of a color is emitted in a color other than the intended color may be prevented. Since the light emitting parts EL may be divided for each of the sub-pixels SPX using joule heating, a separating structure may not be additionally required, and convenience of a manufacturing process may be improved.

In step S2420, a first voltage may be supplied to the first line L1 (for example, the (1-1)-th line L1-1 and the (1-2)-th line L1-2), the first line L1 may form joule heating. For example, a pulse input of voltage may be provided to the first line L1, and heat energy may be applied to the area adjacent to the first line L1. A numerical range of the first voltage and an input method through which the first voltage may be provided are not limited to specific examples.

In step S2420, a portion of the pixel defining layer PDL adjacent to the first line L1 may be exposed. For example, due to the heat formed by the first line L1, a portion of the base light emitting part EL1_B may be removed, and thus a first opening OP1 exposing the pixel defining layer PDL may be formed.

Referring to FIG. 2 together, since the first line L1 may have a closed loop shape surrounding an area, the first opening OP1 may also have a closed loop shape surrounding an area.

In step S2420, at least a portion of the base light emitting part EL1_B may be removed, and the first light emitting part EL1 and the remaining light emitting part EL1_R may be provided (or patterned). For example, a portion of the base light emitting part EL1_B adjacent to the first line L1 may be removed, and the first light emitting part EL1 and the remaining light emitting part EL1_R spaced apart from each other may be formed. Accordingly, the first light emitting part EL1 may be disposed in the area surrounded by the first line L1, and the remaining light emitting part EL1_R may be disposed outside the first line L1. By performing step S2420, the first light emitting part EL1 provided separately in an area where the first sub-pixel area SPXA1 may be to be formed may be manufactured.

In case that step S2420 is performed, the second line L2 may be covered by the remaining light emitting part EL1_R and may not be exposed.

Referring to FIGS. 9 to 11 and 17, in patterning the layers for defining the first sub-pixel (S240), forming the base cathode electrode and the first base capping layer (S2430) may be performed.

In step S2430, a base cathode electrode CE_B and a first base capping layer CPL1_B may be formed in the display area DA. For example, the base cathode electrode CE_B and the first base capping layer CPL1_B may be entirely deposited.

In step S2430, the base cathode electrode CE_B may cover the first line L1 and may be electrically connected to the first line L1. The base cathode electrode CE_B may be in physical contact with the first line L1. Accordingly, the base cathode electrode CE_B may be electrically connected to the second power line PL2 through the first line L1 and the contact member CNP. At least a portion of the base cathode electrode CE_B may fill the first opening OP1, may contact the pixel defining layer PDL in an area corresponding to the first opening OP1, and may cover the first light emitting part EL1 and the remaining light emitting part EL1_B.

In step S2430, the first base capping layer CPL1_B may cover the base cathode electrode CE_B. The first base capping layer CPL1_B may passivate the base cathode electrode CE_B and layers thereunder.

Referring to FIGS. 9 to 11, 18, and 19, in patterning the layers for defining the first sub-pixel (S240), removing at least a portion of a layer adjacent to the second line (S2440) may be performed. The layer adjacent to the second line L2 removed in step S2440 may include the remaining light emitting part EL1_R, a portion of the base cathode electrode CE_B, and a portion of the first base capping layer CPL1_B.

In step S2440, a second voltage may be supplied to the second line L2 (for example, the (2-1)-th line L2-1 and the (2-2)-th line L2-2), and the second line L2 may form joule heating. For example, a pulse input of voltage may be provided to the second line L2, and heat energy may be applied to the area adjacent to the second line L2. A numerical range of the second voltage and an input method through which the second voltage may be provided are not limited to specific examples.

According to an embodiment, the second voltage may be different from the first voltage supplied to the first line L1 described above. For example, as the second voltage increases, a size of the second opening OP2 may increase. The size of the second opening OP2 may correspond to a range in which the inorganic encapsulation structure may be formed. Accordingly, the range in which the inorganic encapsulation structure may be formed may be controlled based on a magnitude of the second voltage.

In step S2440, a portion of the pixel defining layer PDL adjacent to the second line L2 may be exposed. For example, due to the heat generated by the second line L2, a portion of the remaining light emitting part EL1_R, a portion of the base cathode electrode CE_B, and a portion of the first base capping layer CPL1_B may be removed, and thus a second opening OP2 exposing the pixel defining layer PDL may be formed. A size of the second opening OP2 may be determined based on an intensity of the voltage applied to the second line L2, a time in case that the voltage may be applied, and the like.

Referring to FIG. 2 together, since the second line L2 may have a closed loop shape surrounding an area, the second opening OP2 may also have a closed loop shape surrounding an area.

In step S2440, at least a portion of the base cathode electrode CE_B may be removed, and the first cathode electrode CE1 and a remaining cathode electrode CE1_R may be provided. For example, a portion of the base cathode electrode CE_B adjacent to the second line L2 may be removed, the first cathode electrode CE1 may be disposed in the area surrounded by the second line L2, and the remaining cathode electrode CE1_R may be disposed outside the second line L2. By performing step S2440, the first cathode electrode CE1 for forming the first sub-pixel SPX1 may be manufactured. As described above, since the base cathode electrode CE_B may be electrically connected to the first line L1, the first cathode electrode CE1 electrically connected to the second power line PL2 through the contact member CNP in the display area DA may be provided.

In step S2440, at least a portion of the first base capping layer CPL1_B may be removed, and the first capping layer CPL1 and a remaining capping layer CPL1_R may be provided. For example, a portion of the first base capping layer CPL1_B adjacent to the second line L2 may be removed, the first capping layer CPL1 may be disposed in the area surrounded by the second line L2, and the remaining capping layer CPL1_R may be disposed outside the second line L2.

In step S2440, according to an embodiment (refer to FIG. 19), the remaining light emitting part EL1_R may be further etched compared to the base cathode electrode CE_B and the first base capping layer CPL1_B, the first light emitting part EL1 may be further etched compared to the cathode electrode CE and the first base capping layer CPL1_B, and thus the void VO may be formed. For example, the remaining light emitting part EL1_R may be formed to be deeper than the base cathode electrode CE_B and the first base capping layer CPL1_B, and the void VO may be formed under the remaining cathode electrode CE1_R and the remaining capping layer CPL1_R. The first light emitting part EL1 may be formed to be deeper than the cathode electrode CE and the first base capping layer CPL1_B, and the void VO may be formed under the cathode electrode CE and the first capping layer CPL1. Accordingly, the void VO may overlap the remaining cathode electrode CE1_R and the remaining capping layer CPL1_R in a plan view, and the void VO may overlap the cathode electrode CE and the first capping CPL1 in a plan view.

Referring to FIGS. 9 to 11, 20, and 21, in patterning the layers for defining the first sub-pixel (S240), forming the second base capping layer (S2450) may be performed.

In step S2450, a second base capping layer CPL2_B may be formed in the display area DA. The second base capping layer CPL2_B may be entirely deposited.

In step S2450, the second base capping layer CPL2_B may cover the remaining capping layer CPL1_R, the second line L2, and the first capping layer CPL1. The second base capping layer CPL2_B may passivate layers disposed under the second base capping layer CPL2_B.

In step S2450, according to an embodiment (refer to FIG. 21), the second base capping layer CPL2_B may be formed directly adjacent to the void VO. For example, the second base capping layer CPL2_B may cover a side of the open void VO. Accordingly, the void VO may be surrounded by one or more layers.

In step S2450, the second base capping layer CPL2_B may contact the pixel defining layer PDL in an area corresponding to the second opening OP2, and thus an inorganic encapsulation structure may be formed.

Referring to FIGS. 9 to 11, 22, and 23, in patterning the layers for defining the first sub-pixel (S240), removing at least a portion of layers disposed outside the second line (S2460) may be performed, and thus the first sub-pixel SPX1 may be provided. The layers disposed outside the second line L2 removed in step S2460 may include a portion of the remaining light emitting part EL1_R, a portion of the remaining cathode electrode CE_R, and a portion of the remaining capping layer CPL_R.

In step S2460, an outer area RA that exposes a portion of the pixel defining layer PDL may be formed outside the second line L2. For example, layers disposed outside the second line L2 may be etched, and the first capping layer CPL1 and the second capping layer CPL2 may passivate layers (for example, the first light emitting element LD1) disposed under the first capping layer CPL1. According to an embodiment, the second capping layer CPL2 may cover an outer surface of the second line L2.

In step S2460, at least a portion of the second capping layer CPL2 adjacent to the second line L2 may not be removed. As described above, the second capping layer CPL2 and the pixel defining layer PDL may contact each other to form the inorganic encapsulation structure. In step S2460, a range in which the second base capping layer CPL2_B may be removed may be adjusted, and thus the inorganic encapsulation structure may be maintained.

In step S2460, among the layers for forming the first sub-pixel SPX1, a portion formed in the second sub-pixel area SPXA2 and the third sub-pixel area SPXA3 may be removed.

In step S2460, according to an embodiment (refer to FIG. 23), a portion of the void VO adjacent to the remaining cathode electrode CE1_R and the remaining capping layer CPL1_R may be removed, and another portion of the void VO adjacent to the cathode electrode CE and the first capping layer CPL1 may not be removed.

Figure 24:
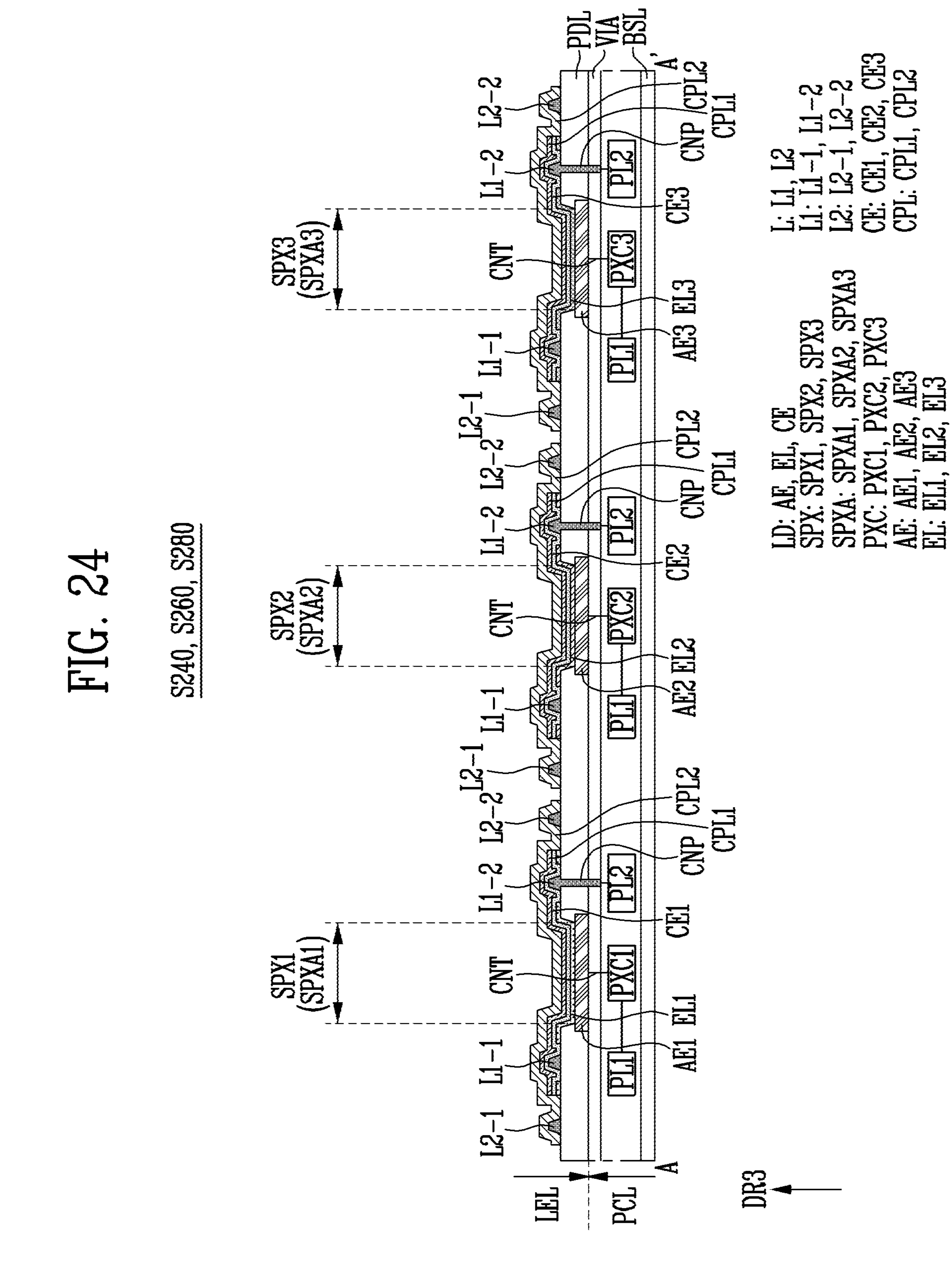

Referring to FIGS. 9, 10, and 24, patterning layers for defining the second sub-pixel (S260) and patterning layers for defining the third sub-pixel (S280) may be performed, and the second and third sub-pixels SPX2 and SPX3 may be provided. FIG. 24 also shows the layers for the first sub-pixel SPX1 provided by performing the step S240 of patterning the layers for defining the first sub-pixel.

According to an embodiment, patterning the layers for defining the second sub-pixel (S260) may be performed in a method similar (for example, substantially equal) to patterning the layers for defining the first sub-pixel (S240) described above. For example, a cathode connection structure for the second sub-pixel SPX2 may be formed using the first line L1, the second light emitting part EL2 may be separated from other light emitting parts EL using the first line L1, and an inorganic-inorganic bonding structure may be formed using the second line L2.

According to an embodiment, patterning the layers for defining the third sub-pixel (S280) may be performed in a method similar (for example, substantially equal) to the method of patterning the layers for defining the first sub-pixel (S240) described above. For example, a cathode connection structure for the third sub-pixel SPX3 may be formed using the first line L1, the third light emitting part EL3 may be separated from other light emitting parts EL using the first line L1, and an inorganic-inorganic bonding structure may be formed using the second line L2.

Figure 25:
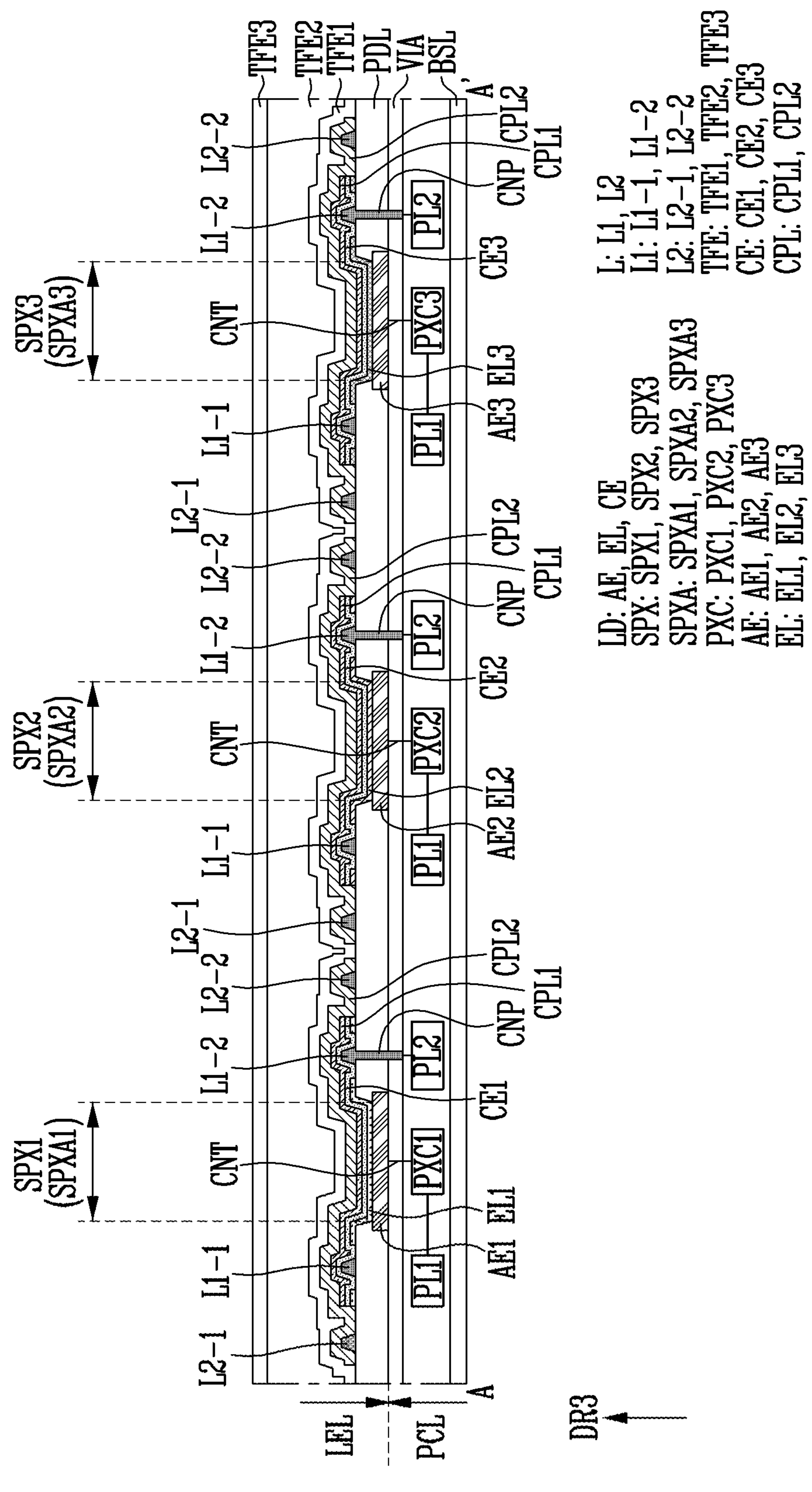

Referring to FIGS. 9, 10, and 25, in forming the encapsulation layer (S290), the encapsulation layer TFE may be formed to cover the first to third sub-pixel areas SPXA1 to SPXA3.

In step S290, the encapsulation layer TFE may be entirely deposited, may cover the first to third light emitting elements LD1 to LD3, and may cover the capping layers CPL.

According to an embodiment, the first to third encapsulation layers TFE1 to TFE3 may be sequentially formed (for example, deposited) to form the encapsulation layer TFE.

According to an embodiment, the light emitting element LD may be protected by the pixel defining layer PDL and the second capping layer CPL2 forming the inorganic encapsulation structure, and may be further protected by the encapsulation layer TFE.

According to a subsequent embodiment, an additional structure (for example, a window or the like) may be further formed on the encapsulation layer TFE, and the display device DD may be provided according to an embodiment.

As described above, although the disclosure has been described with reference to the embodiment above, those skilled in the art or those having a common knowledge in the art will understand that the disclosure may be variously modified and changed without departing from the spirit and technical area of the disclosure described in the claims which will be described later.

Therefore, the technical scope of the disclosure should not be limited to the contents described in the detailed description of the specification, but should be defined by the claims.

What is claimed is:

1. A display device including a sub-pixel area, comprising:

a pixel circuit layer including a base layer and a pixel circuit disposed on the base layer; and a light emitting element layer disposed on the pixel circuit layer and including a light emitting element, a pixel defining layer, a capping layer, and a line electrically connected to the pixel circuit, wherein the light emitting element includes an anode electrode, a cathode electrode, and a light emitting part, at least a portion of the light emitting part being disposed between the anode electrode and the cathode electrode, the pixel defining layer covers at least a portion of the anode electrode, at least a portion of the capping layer is in contact with the pixel defining layer, the line is disposed on the pixel defining layer and includes a first line and a second line spaced apart from each other, each of the first line and the second line is disposed in a closed loop, the first line surrounds the sub-pixel area in a plan view, the second line surrounds the first line in a plan view, and the light emitting part is disposed in an area surrounded by the first line.

2. The display device according to claim 1, wherein the line includes a conductive material having an electrical conductivity less than about $4.0\times10^{7}$ (S/m) at about 20° C.

3. The display device according to claim 2, wherein the line includes aluminum (Al) or molybdenum (Mo).

4. The display device according to claim 1, wherein the first line and the second line include a same material, and each of the first line and the second line is disposed on a surface of the pixel defining layer.

5. The display device according to claim 1, wherein the first line is disposed around the sub-pixel area, the second line is disposed around the first line, the sub-pixel area includes a first sub-pixel area, a second sub-pixel area, and a third sub-pixel area, and the first line includes a first line portion surrounding the first sub-pixel area, a second line portion surrounding the second sub-pixel area, and a third line portion surrounding the third sub-pixel area.

6. The display device according to claim 5, wherein the cathode electrode includes a first cathode electrode overlapping the first sub-pixel area, a second cathode electrode overlapping the second sub-pixel area, and a third cathode electrode overlapping the third sub-pixel area, and the first cathode electrode, the second cathode electrode, and the third cathode electrode are physically separated from each other.

7. The display device according to claim 1, wherein the pixel circuit layer includes a first power line and a second power line having different potentials, the first power line is electrically connected to the pixel circuit, and the second power line is electrically connected to the cathode electrode through the first line.

8. The display device according to claim 7, further comprising:

a display area and a non-display area surrounding at least a portion of the display area, wherein the first line is electrically connected to the second power line through a contact portion at least partially passing through the pixel defining layer, the second power line has a thickness greater than that of the cathode electrode, and the contact portion is disposed in the display area.

9. The display device according to claim 1, wherein the capping layer includes a first capping layer and a second capping layer disposed on the first capping layer, the first capping layer covers the first line and does not cover the second line, and the second capping layer covers the second line.

10. The display device according to claim 9, wherein each of the second capping layer and the pixel defining layer includes an inorganic material and the second capping layer and the pixel defining layer contact each other in an area adjacent to the second line.

11. A display device comprising:

a display area and a non-display area surrounding at least a portion of the display area;

a pixel circuit layer including a base layer, a pixel circuit, a power line disposed on the base layer, and a via layer covering the power line; and a light emitting element layer disposed on the pixel circuit layer and including a light emitting element, a pixel defining layer, and a line electrically connected to the pixel circuit, wherein the light emitting element includes an anode electrode, a cathode electrode, and a light emitting part, at least a portion of the light emitting part is disposed between the anode electrode and the cathode electrode, the pixel defining layer overlaps the anode electrode in a plan view, the line is directly disposed on the pixel defining layer and includes a first line and a second line spaced apart from each other, the power line is disposed across the display area and the non-display area, the cathode electrode and the power line are electrically connected in the display area through a contact member passing through the via layer, and the power line has a thickness greater than that of the cathode electrode.

* * * * *